(12) United States Patent
Taguchi et al.

(10) Patent No.: US 8,304,862 B2
(45) Date of Patent: Nov. 6, 2012

(54) SEMICONDUCTOR PACKAGE AND MANUFACTURING METHOD OF THE SAME

(75) Inventors: Yuichi Taguchi, Nagano (JP);
Mitsutoshi Higashi, Nagano (JP);
Akinori Shiraishi, Nagano (JP);
Hideaki Sakaguchi, Nagano (JP);
Masahiro Sunohara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 25 days.

(21) Appl. No.: 12/644,390

(22) Filed: Dec. 22, 2009

(65) Prior Publication Data
US 2010/0155928 A1  Jun. 24, 2010

(30) Foreign Application Priority Data
Dec. 24, 2008 (JP) ................................. 2008-328257

(51) Int. Cl.
*H01L 23/52* (2006.01)
*H01L 21/60* (2006.01)
*H01L 23/48* (2006.01)

(52) U.S. Cl. ........ 257/621; 257/629; 257/773; 257/774; 257/E23.141; 257/E23.169; 257/E21.538; 438/667

(58) Field of Classification Search .................. 257/621, 257/692, 773, 774, E23.141, E23.169, E21.538; 438/667
See application file for complete search history.

(56) References Cited

U.S. PATENT DOCUMENTS

| | | | | |
|---|---|---|---|---|
| 3,698,082 A | * | 10/1972 | Hyltin et al. | 29/856 |
| 4,597,029 A | * | 6/1986 | Kucharek et al. | 361/775 |
| 2002/0027020 A1 | * | 3/2002 | Kobayashi et al. | 174/261 |
| 2002/0030245 A1 | * | 3/2002 | Hanaoka et al. | 257/621 |
| 2007/0290300 A1 | * | 12/2007 | Kawakami | 257/621 |
| 2009/0127667 A1 | | 5/2009 | Iwata | |

FOREIGN PATENT DOCUMENTS

| | | |
|---|---|---|
| JP | 2001-127242 | 5/2001 |
| JP | 2004-296488 | 10/2004 |
| JP | 2008-153340 | 7/2008 |

* cited by examiner

*Primary Examiner* — Eugene Lee
*Assistant Examiner* — Peniel M Gumedzoe
(74) *Attorney, Agent, or Firm* — Rankin, Hill & Clark LLP

(57) ABSTRACT

A semiconductor package includes: a wiring board; and a semiconductor device which is formed on the wiring board; wherein the semiconductor device includes: a semiconductor chip; and a penetration electrode, one end of which is fixed on one plane of the semiconductor chip, and the other end of which penetrates the semiconductor chip and is fixed on the other plane of the semiconductor chip, the penetration electrode penetrating the semiconductor chip in such a manner that the penetration electrode is not contacted to a wall plane of the semiconductor chip by a space portion formed in the semiconductor chip; and the wiring board and the semiconductor device are electrically connected via the penetration electrode.

13 Claims, 29 Drawing Sheets

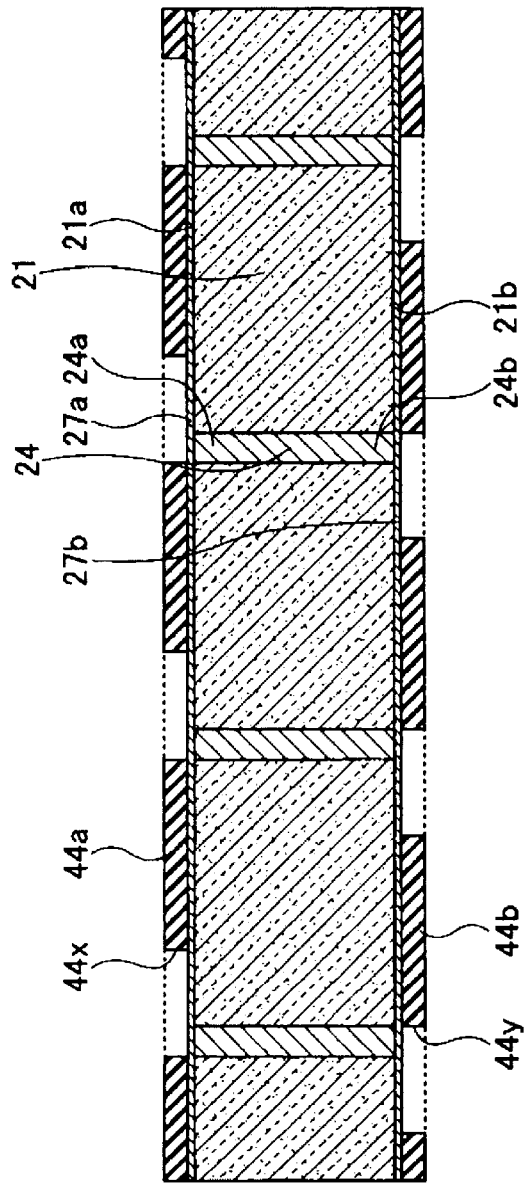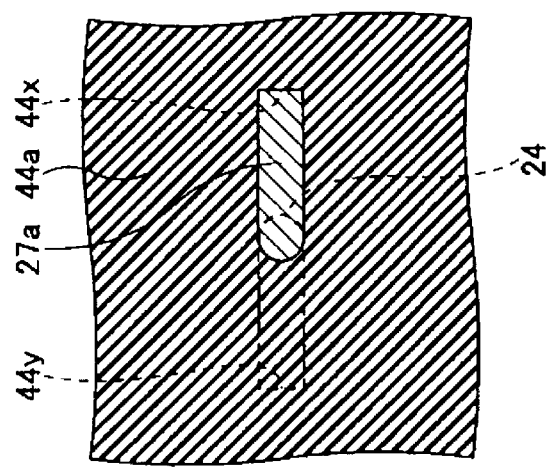
FIG. 8A
FIG. 8B

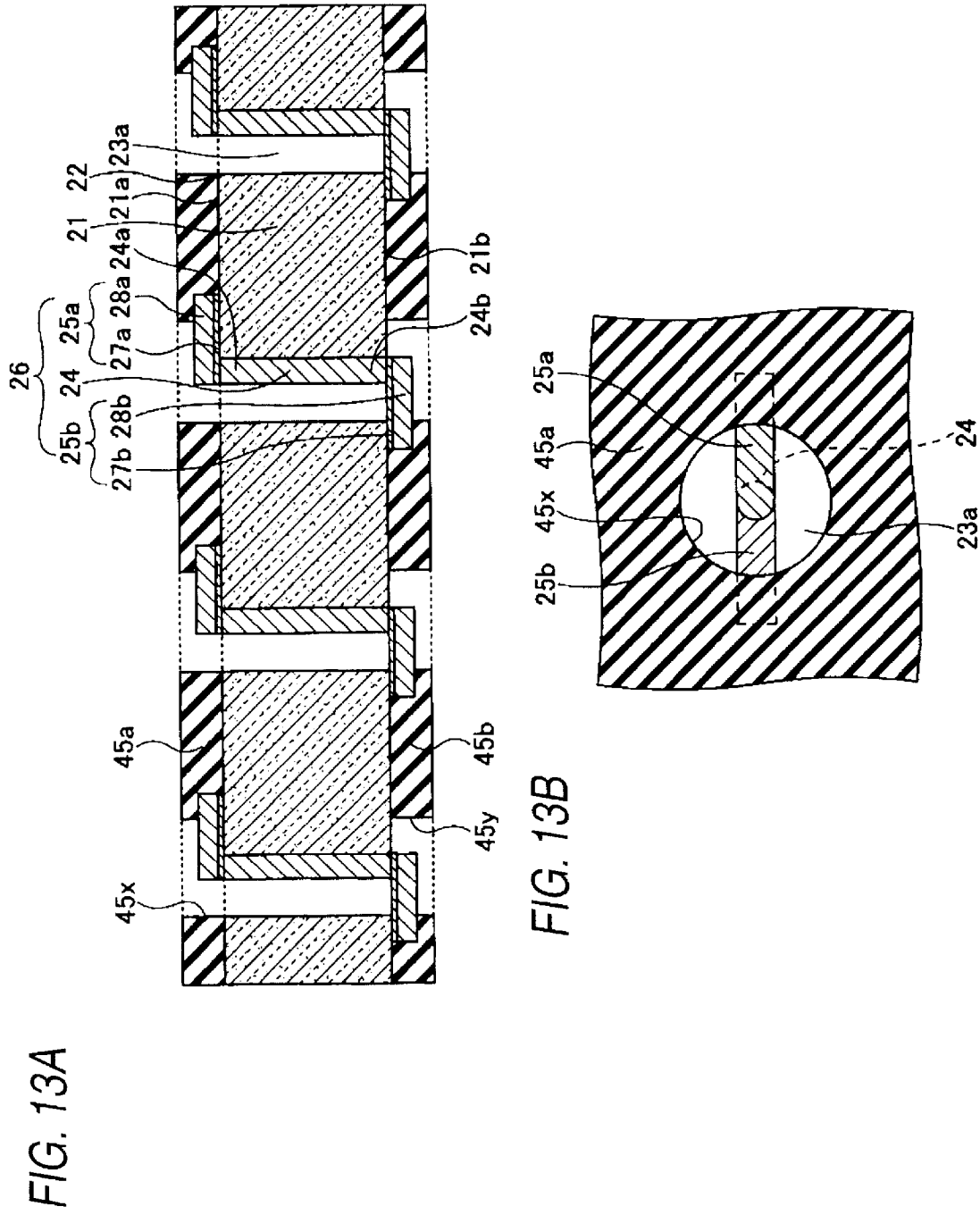

SEMICONDUCTOR PACKAGE AND MANUFACTURING METHOD OF THE SAME

CROSS-REFERENCE TO RELATED APPLICATION

This application is based on and claims priority under 35 U.S.C. §119 from Japanese Patent Application No. 2008-32857 filed on Dec. 24, 2008.

BACKGROUND OF THE INVENTION

1. Technical Field

The present invention is related to a semiconductor package constructed by containing a wiring board and a semiconductor device having a semiconductor chip, and also, related to a manufacturing method thereof.

2. Related Art

Conventionally, semiconductor packages in which semiconductor devices are mounted on wiring boards are known in the field. FIG. 1 is a sectional view for partially exemplifying a conventional semiconductor package 300. Referring to FIG. 1, the semiconductor package 300 has a semiconductor device 400 and a wiring board 500. The semiconductor device 400 has a semiconductor chip 410 and connecting terminals 420.

The semiconductor chip 410 is a semiconductor chip in which a semiconductor integrated circuit (not shown) and electrode pads (not shown) are formed on a semiconductor substrate (not shown) which is made of silicon, or the like in a thin plate form, while the connecting terminals 420 are formed on the electrodes (not shown). As the connecting terminals 420, for instance, solder bumps, and the like may be employed.

The wiring board 500 has an insulating layer 530, a wiring layer 540, a solder resist layer 550, and pre-solder 570. In the wiring board 500, the wiring layer 540 is formed, and furthermore, the solder resist layer 550 having an opening portion 550x is formed on the insulating layer 530. The pre-solder 570 is formed on a portion of the wiring layer 540, which is exposed from the opening portion 550x. As the wiring layer 540, for example, Cu, and the like may be employed. As the insulating layer 530, for instance, an epoxy resin, and a material (glass epoxy) in which cloths made of glass fiber are contained in an epoxy resin may be employed.

The connecting terminals 420 of the semiconductor device 400 are electrically connected to the pre-solder 570 formed on the wiring layer 540 of the wiring board 500.
[Patent Publication 1] JP-A-2004-296488
[Patent Publication 2] JP-A-2008-153340

On one hand, for instance, in the case that glass epoxy is employed as the insulating layer 530, a thermal expansion coefficient of the glass epoxy is of the order of 18 ppm/° C. On the other hand, in such a case that as the semiconductor substrate (not shown) which constitutes the semiconductor chip 410, for example, silicon is employed, a thermal expansion coefficient of the silicon is of the order of 3 ppm/° C. Due to such a difference between the thermal expansion coefficients, there is a problem that when heat is applied to the semiconductor package 300, stresses are produced in joining portions (between connecting terminals 420 and pre-solder 570), and thus, cracks occur therein.

SUMMARY OF THE INVENTION

The present invention has be made to solve the above-described problem, and has an object to provide a semiconductor package capable of relaxing a stress produced in a joining portion for joining a semiconductor device to a wiring board in such a case that heat is applied to the semiconductor package, and thus, capable of preventing an occurrence of a crack, and further, to provide a method of manufacturing the above-described semiconductor package.

According to a first aspect of the invention, there is provided a semiconductor package including:
a wiring board; and
a semiconductor device which is formed on the wiring board; wherein
the semiconductor device includes:
a semiconductor chip; and
a penetration electrode, one end of which is fixed on one plane of the semiconductor chip, and the other end of which penetrates the semiconductor chip and is fixed on the other plane of the semiconductor chip, the penetration electrode penetrating the semiconductor chip in such a manner that the penetration electrode is not contacted to a wall plane of the semiconductor chip by a space portion formed in the semiconductor chip; and
the wiring board and the semiconductor device are electrically connected via the penetration electrode.

According to a second aspect of the invention, there is provided a semiconductor package including:
a wiring board; and
a semiconductor device which is formed via an interposer on the wiring board; wherein
the interposer includes:
a substrate; and
a penetration electrode, one end of which is fixed on one plane of the substrate, and the other end of which penetrates the substrate and is fixed on the other plane of the substrate, the penetration electrode penetrating the substrate in such a manner that the penetration electrode is not contacted to a wall plane of the substrate by a space portion formed in the substrate; and
the wiring board and the semiconductor device are electrically connected via the penetration electrode.

According to a third aspect of the invention, there is provided the semiconductor package as in the first aspect, wherein
the one end and the other end of the penetration electrode are electrically connected to a wiring layer of the semiconductor chip.

According to a fourth aspect of the invention, there is provided the semiconductor package as in any one of the first to third aspects, wherein
the penetration electrode includes:
a penetration portion arranged in the space portion;
a first supporting portion having elasticity, which is constructed with the penetration portion in an integral manner and is fixed on the one plane; and
a second supporting portion having elasticity, which is constructed with the penetration portion in an integral manner and is fixed on the other plane.

According to a fifth aspect of the invention, there is provided the semiconductor package as in the fourth aspect, further including:
projection portions made of a metal provided on surfaces of the first supporting portion and the second supporting portion.

According to a sixth aspect of the invention, there is provided the semiconductor package as in any one of the first to fifth aspects, wherein
a wall plane of either the semiconductor chip or the substrate within the space portion is covered with an insulating film.

According to a seventh aspect of the invention, there is provided the semiconductor package as in any one of the first to sixth aspects, wherein
the penetration electrode is made of Cu (copper).

According to an eighth aspect of the invention, there is provided the semiconductor package as in any one of the first to seventh aspects, further including:
one or a plurality of semiconductor devices formed on the semiconductor device, wherein
the semiconductor device is electrically connected to the one, or the plurality of semiconductor devices via penetration electrodes formed thereon.

According to a ninth aspect of the invention, there is provided a manufacturing method of a semiconductor package, including:
a penetration hole forming step for forming a penetration hole in a semiconductor chip which constitutes a semiconductor device, the penetration hole penetrating the semiconductor chip form one plane to the other plane of the semiconductor chip;
a penetration portion forming step for filling a metal inside the penetration hole to form a penetration portion which constitutes a portion of the penetration electrode;
a supporting portion forming step for forming a first supporting portion which constitutes a portion of the penetration electrode, and a second supporting portion which constitutes a portion of the penetration electrode, one end of the first supporting portion being fixed on one plane of the semiconductor chip and the other end of the first supporting portion being connected to a plane of the penetration portion on the side of the one plane of the semiconductor chip, and one end of the second supporting portion being fixed on the other plane of the semiconductor chip and the other end of the second supporting portion being connected to a plane of the penetration portion on the side of the other plane of the semiconductor chip;
a space portion forming step for removing the semiconductor chip of a portion contacted to a side plane of the penetration portion to form a space portion by which an entire side plane of the penetration portion is exposed to a peripheral portion of the penetration portion;
a preparing step for preparing a wiring board; and
a connecting step for electrically connecting the wiring board and the semiconductor device via the penetration electrode.

According to a tenth aspect of the invention, there is provided a manufacturing method of a semiconductor package, including:
a penetration hole forming step for forming a penetration hole in a substrate which constructs an interposer, the penetration hole penetrating the substrate from one plane to the other plane of the substrate;
a penetration portion forming step for filling a metal inside the penetration hole to form a penetration portion which constitutes a portion of the penetration electrode;
a supporting portion forming step for forming a first supporting portion which constitutes a portion of the penetration electrode, and a second supporting portion which constitutes a portion of the penetration electrode, one end of the first supporting portion being fixed on one plane of the substrate and the other end of the first supporting portion being connected to a plane of the penetration portion on the side of the one plane of the substrate, and one end of the second supporting portion being fixed on the other plane of the substrate and the other end of the second supporting portion being connected to a plane of the penetration portion on the side of the other plane of the substrate;

a space portion forming step for removing the substrate of a portion contacted to a side plane of the penetration portion to form a space portion by which an entire side plane of the penetration portion is exposed to a peripheral portion of the penetration portion;
a preparing step for preparing a wiring board and a semiconductor device; and
a connecting step for arranging the semiconductor device through the interposer on the wiring board to electrically connect the wiring board and the semiconductor device via the penetration electrode.

According to an eleventh aspect of the invention, there is provided the manufacturing method of a semiconductor package as in the ninth or tenth aspect, wherein
the supporting portion forming step includes:
a step for forming a first resist film and a second resist film on the one plane and the other plane respectively;
a step for forming a first opening portion at a position of the first resist film, which corresponds to the first supporting portion, and for forming a second opening portion at a position of the second resist film, which corresponds to the second supporting portion;
a step for filling a metal which constitutes the first supporting portion and the second supporting portion into the first opening portion and the second opening portion respectively; and
a step for removing the first resist film and the second resist film.

According to a twelfth aspect of the invention, there is provided the manufacturing method of a semiconductor package as in any one of the ninth to eleventh aspects, wherein
the space portion forming step includes:
a step for forming a third resist film and a fourth resist film on the one plane and the other plane respectively;
a step for forming a third opening portion at a position of the third resist film, which corresponds to the space portion, and for forming a fourth opening portion at a position of the fourth resist film, which corresponds to the space portion;
a step for etching the third opening portion from the one plane side;
a step for etching the fourth opening from the other plane side; and
a step for removing the third resist film and the fourth resist film.

According to a thirteenth aspect of the invention, there is provided the manufacturing method of a semiconductor package as in the eleventh aspect, further including:
a projection portion forming step for forming a projection portion made of a metal on each surface of the first supporting portion and the second supporting portion after the metal filling step, wherein
the projection portion forming step includes:
a step for forming a fifth resist film in such a manner that the first resist film and the metal filled into the first opening portion are covered, and for forming a sixth resist film in such a manner that the second resist film and the metal filled into the second opening portion are covered;
a step for forming a fifth opening portion at a position of the fifth resist film, which corresponds to the projection portion, and for forming a sixth opening portion at a position of the sixth resist film, which corresponds to the projection portion;
a step for filling a metal which constitutes the projection portions into the fifth opening portion and the sixth opening portion respectively; and
a step for removing the fifth resist film and the sixth resist film.

In accordance with the disclosed technique, the present invention can provide the semiconductor package capable of relaxing the stress produced in the joining portion for joining the semiconductor device to the wiring board in such a case that the heat is applied to the semiconductor package, and thus, capable of preventing the occurrence of the crack, and further, can provide the method of manufacturing the above-described semiconductor package.

BRIEF DESCRIPTION OF THE DRAWINGS

FIGS. 8A and 8B are diagrams (No. 5) for exemplifying a manufacturing step of the semiconductor package according to the first embodiment mode.

FIGS. 13A and 13B are diagrams (No. 10) for exemplifying a manufacturing step of the semiconductor package according to the first embodiment mode.

DETAILED DESCRIPTION OF THE PREFERRED EMBODIMENTS

Referring now to drawings, a description is made of embodiment modes of the present invention.

<First Embodiment Mode>

[Structure of Semiconductor Package Related to First Embodiment Mode]

Figure 1:
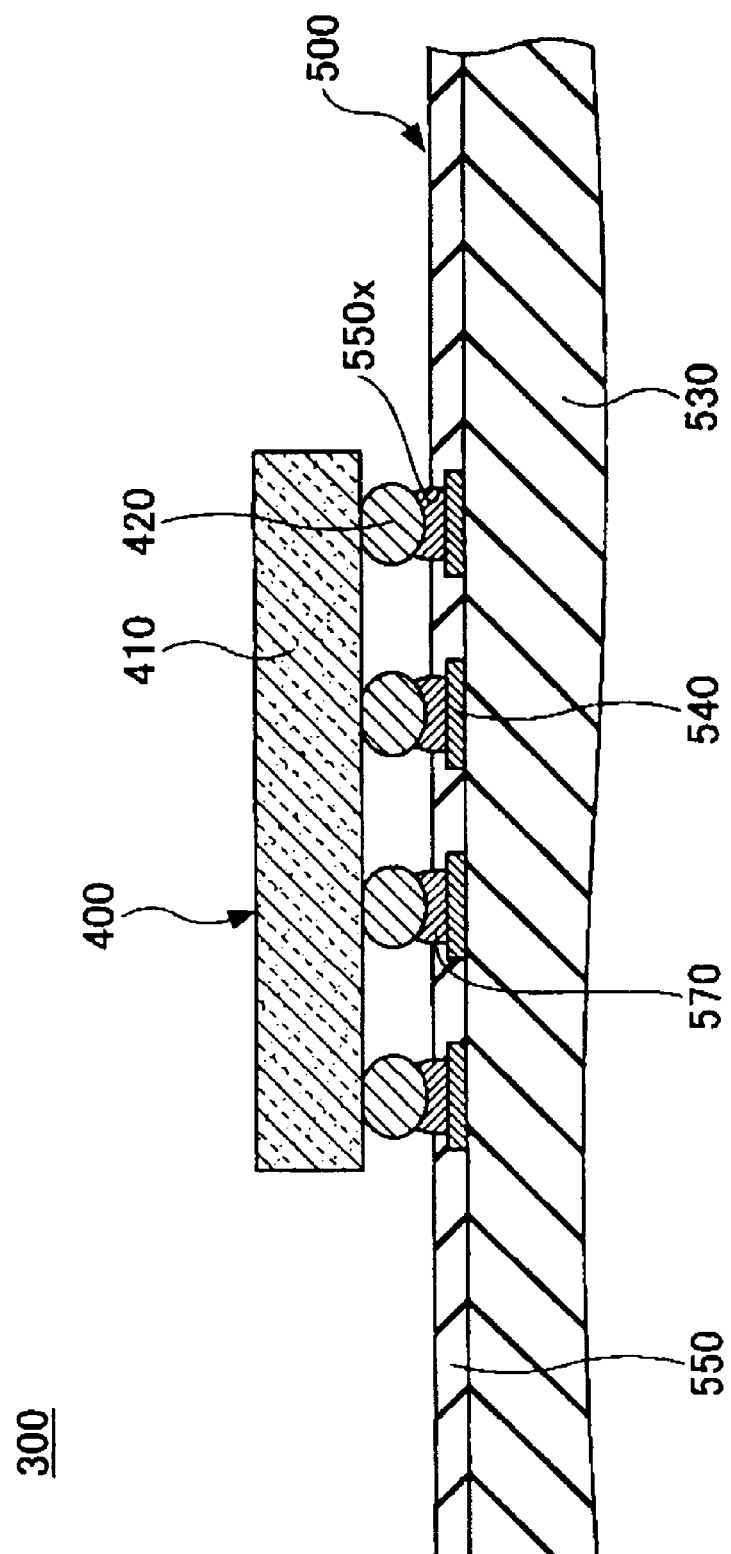
FIG. 1 is a sectional view for partially exemplifying the conventional semiconductor package.
Figure 2:
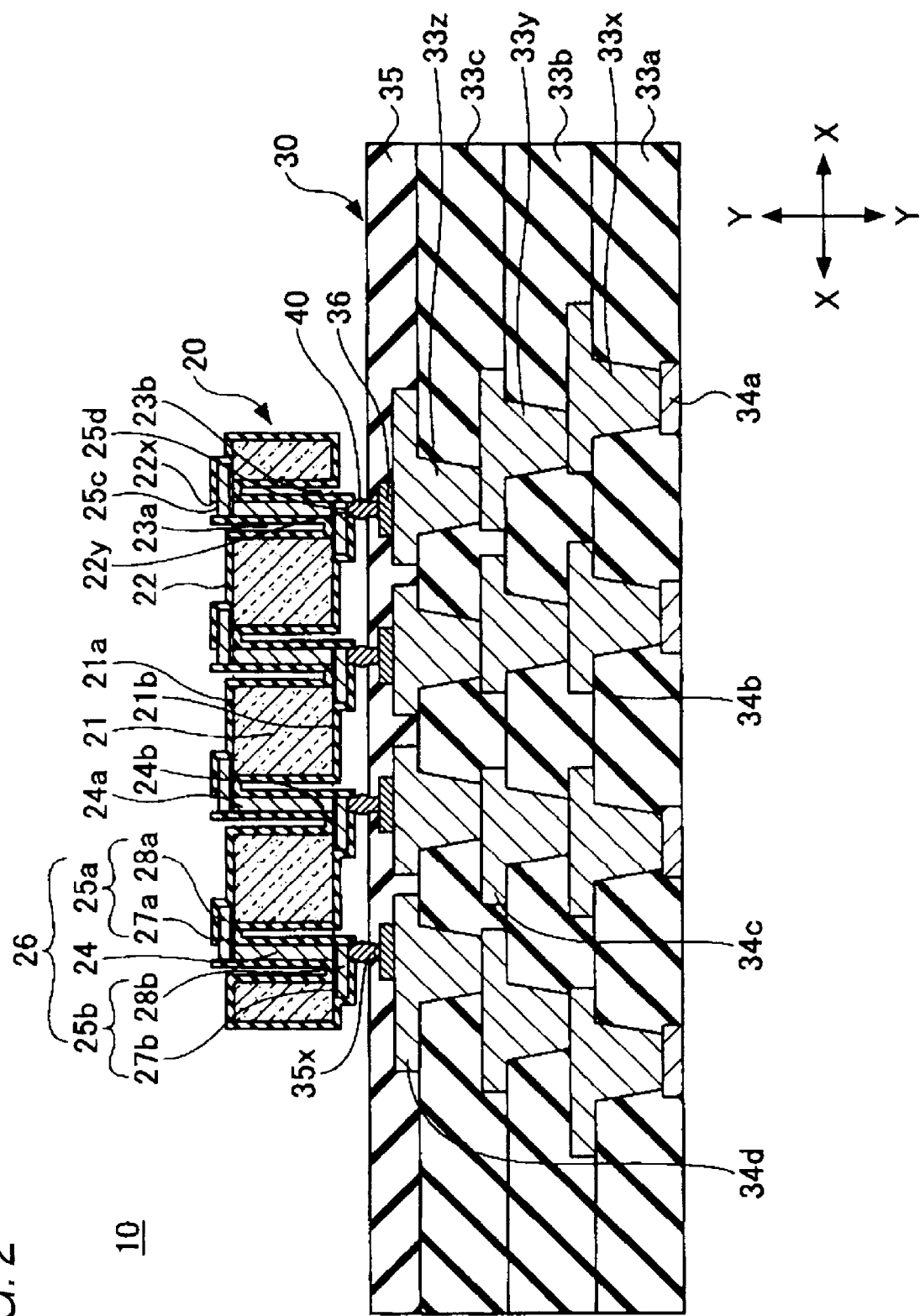
FIG. 2 is a diagram for exemplifying a semiconductor package according to a first embodiment mode of the present invention.
Figure 3:
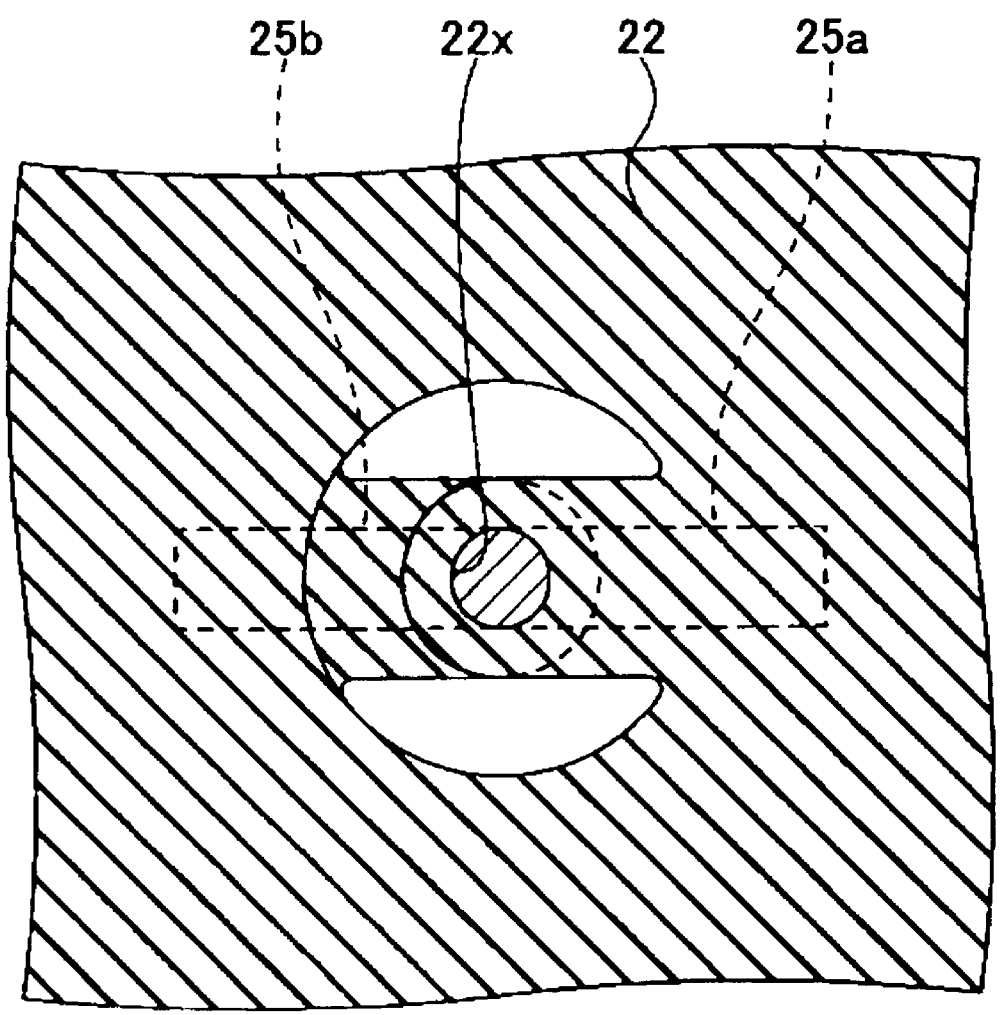
FIG. 3 is a diagram in which a penetration electrode portion represented in FIG. 2 is viewed on the plane.

Firstly, a description is made of a structure of a semiconductor package according to a first embodiment mode of the present invention. FIG. 2 is a diagram for exemplifying the semiconductor package according to the first embodiment mode. FIG. 3 is a view for showing a penetration electrode portion indicated in FIG. 2, as viewed on the plane. In FIG. 2, an X-X direction indicates a plane direction which is parallel to an upper plane 21a of a semiconductor chip 21 (will be explained later), and a Y-Y direction indicates a direction perpendicular to the X-X direction. In FIG. 3, the same reference numerals will be given to the same structural portions of FIG. 2, and descriptions thereof will be sometimes omitted.

Referring to FIGS. 2 and 3, a semiconductor package 10 related to the first embodiment mode has a semiconductor device 20, a wiring board 30, and a joining portion 40. The semiconductor device 20 has a semiconductor chip 21, an insulating film 22, a space portion 23a, another space portion 23b, and a penetration electrode 26.

While a semiconductor integrated circuit (not shown) is provided on the semiconductor chip 21, the semiconductor integrated circuit is constituted by a diffusion layer (not shown), an insulating layer (not shown), a via (not shown), a wiring layer (not shown), and the like. As a material of the semiconductor chip 21, for example, silicon, and the like may be employed. A thickness of the semiconductor chip 21 may be made as, for instance, 300 μm.

The insulating film 22 is a film which insulates a space between the semiconductor chip 21 and the penetration electrode 26. The insulating film 22 is provided in such a manner that an entire surface (which further contains wall plane of semiconductor chip 21 of portions corresponding to space portions 23a and 23b) of the semiconductor chip 21, and a portion of the penetration electrode 26 are covered. The insulating film 22 has opening portions 22x and 22y. The opening portion 22x exposes a portion of an upper plane 25c of a supporting portion 25a, which is overlapped with the penetration portion 24, as viewed on the plane. Also, the opening portion 22y exposes a portion of a lower plane 25d of a supporting portion 25b, which is overlapped with the penetration portion 24, as viewed on the plane. As the insulating film 22, for instance, $SiO_2$ may be employed. The insulating film 22 may be formed by, for instance, a CVD method. A thickness of the insulating film 22 may be made as, for example, 0.5 μm to 1.0 μm.

The space portions 23a and 23b are formed in portions of the semiconductor chip 21, in which the semiconductor integrated circuit (not shown) is not present. The space portions 23a and 23b are provided in such a manner that an entire side plane of the penetration portion 24 is exposed to a peripheral portion of the penetration portion 24.

The penetration electrode 26 is constructed of the penetration portion 24 and the supporting portions 25a and 25b. The penetration portion 24 is made of a material having electric conductivity. The penetration portion 24 is separated from the semiconductor chip 21 and the insulating film 22 by the space portions 23a and 23b, and penetrates the semiconductor chip 21 under the condition that the penetration portion 24 is not contacted to the semiconductor chip 21 and the insulating film 22.

An edge portion 24a (one edge portion) of the penetration portion 24 is constructed with the supporting portion 25a in an integral manner. Another edge portion 24b (the other edge portion) of the penetration portion 24 is constructed with the supporting portion 25b in an integral manner. A shape of the penetration portion 24 is, for example, a circle, as viewed on the plane, and a diameter thereof may be made as, for instance, 30 μm.

The supporting portions 25a and 25b which construct the penetration electrode 26 are constituted by seed layers 27a and 27b and plating films 28a and 28b, while the seed layers 27a and 27b are made of a material having electric conductivity. In the supporting portion 25a, one edge portion is constructed with the edge portion 24a of the penetration portion 24 in an integral manner, and the other edge portion is fixed on an upper plane 21a (one plane of semiconductor chip 21) of the semiconductor chip 21 and is electrically connected to a wiring layer (not shown) formed on the semiconductor chip 21. In the supporting portion 25b, one edge portion is constructed with the edge portion 24b of the penetration portion 24 in an integral manner, and the other edge portion is fixed on a lower plane 21b (the other plane of semiconductor chip 21) of the semiconductor chip 21 and is electrically connected to a wiring layer (not shown) formed on the semiconductor chip 21. It should be noted that the wiring layer (not shown) is a wiring layer drawn from the semiconductor integrated circuit (not shown).

The supporting portions 25a and 25b have elasticity, and are members which support an entire portion of the penetration portion 24 under such a condition that the penetration portion 24 can be moved along the X-X direction and the Y-Y direction. As a material of the penetration electrode 26 constructed of the penetration portion 24 and the supporting portions 25a and 25b, for example, Cu may be employed. Since Cu is employed as the material of the penetration electrode 26, the supporting portions 25a and 25b may have the elasticity, and may be easily formed by employing a plating method, and the like.

Portions of the upper plane 25c of the supporting portion 25a and the lower plane 25d of the supporting portion 25b, which are exposed within the opening portions 22x and 22y, function as electrode pads when these portions are electrically connected to a wiring board, a semiconductor device, and the like. For instance, an Ni/Au plating layer, or the like, may be alternatively formed on the portions of the upper plane 25c of the supporting portion 25a and the lower plane 25d of the supporting portion 25b, which are exposed within the opening portions 22x and 22y, while an Ni plating layer and an Au plating layer are stacked on each other in this order in the Ni/Au plating layer.

The wiring board 30 corresponds to a wiring board equipped with a build-up wiring layer containing a first insulating layer 33a, a second insulating layer 33b, a third insulating layer 33c, a first wiring layer 34a, a second wiring layer 34b, a third wiring layer 34c, a fourth wiring layer 34d, a solder resist layer 35, and a metal layer 36.

In the wiring board 30, the first wiring layer 34a is formed at the lowermost layer. The first insulating layer 33a is formed in such a manner that the first wiring layer 34a is covered, and the second wiring layer 34b is formed on the first insulating layer 33a. Further, the second insulating layer 33b is formed in such a manner that the second wiring layer 34b is covered, and the third wiring layer 34c is formed on the second insulating layer 33b. Moreover, the third insulating layer 33c is formed in such a manner that the third wiring layer 34c is covered, and the fourth wiring layer 34d is formed on the third insulating layer 33c. While the first wiring layer 34a is exposed from the first insulating layer 33a, the first wiring layer 34a functions as an electrode pad to be connected to a mother board, and the like.

The first wiring layer 34a is electrically connected to the second wiring layer 34b via a first via hole 33x formed in the first insulating layer 33a. Also, the second wiring layer 34b is electrically connected to the third wiring layer 34c via a second via hole 33y formed in the second insulating layer 33b. Further, the third wiring layer 34c is electrically connected to the fourth wiring layer 34d via a third via hole 33z formed in the third insulating layer 33c.

The solder resist layer 35 having an opening portion 35x is formed in such a manner that the fourth wiring layer 34d is covered. The metal layer 36 is formed on the fourth wiring layer 34d within the opening portion 35x of the solder resist layer 35. The metal layer 36 may be formed as, for instance, an Ni/Au plating layer, or the like on the fourth wiring layer 34d within the opening portion 35x of the solder resist layer 35, in which an Ni plating layer and an Au plating layer are stacked on each other in this order.

The joining portion 40 is a terminal provided in order to electrically connect the semiconductor device 20 to the wiring board 30. Concretely speaking, the joining portion 40 connects the lower plane 25d of the supporting member 25b exposed within the opening portion 22y in the semiconductor device 20 to the metal layer 36 in the wiring board 30. The joining portion 40 may be formed as, for example, a solder bump.

As previously described, the semiconductor device 20 is Electrically and mechanically connected via the joining portion 40 to the wiring board 30. As previously described, while the supporting portions 25a and 25b have the elasticity, the supporting portions 25a and 25b support the entire portion of the penetration portion 24 under movable condition along the X-X direction and the Y-Y direction. Assuming now that heat is applied to the semiconductor package 10, as previously explained, in general, since there is a difference in the thermal expansion coefficients of the semiconductor device 20 and the wiring board 30, it is conceivable that stresses may be produced in the joining portion 40. However, similar to the penetration portion 24, since the joining portion 40 is supported under such a condition that the joining portion 40 can be moved along the X-X direction and the Y-Y direction by the supporting portions 25a and 25b having the elasticity, the stresses produced in the joining portion 40 can be largely relaxed. As a consequence, it is possible to avoid that a crack occurs in the joining portion 40.

[Manufacturing Method of Semiconductor Package Related to First Embodiment Mode]

Subsequently, a description is made of a method for manufacturing a semiconductor package, according to a first embodiment mode of the present invention. FIGS. 4 to 19 are diagrams for exemplifying manufacturing steps of the semiconductor package, related to the first embodiment mode. In FIGS. 4 to 19, the same reference numerals will be employed as those for denoting the same structural portions of the semiconductor package 10 indicated in FIG. 2, and explanations thereof will be sometimes omitted.

Figure 4:
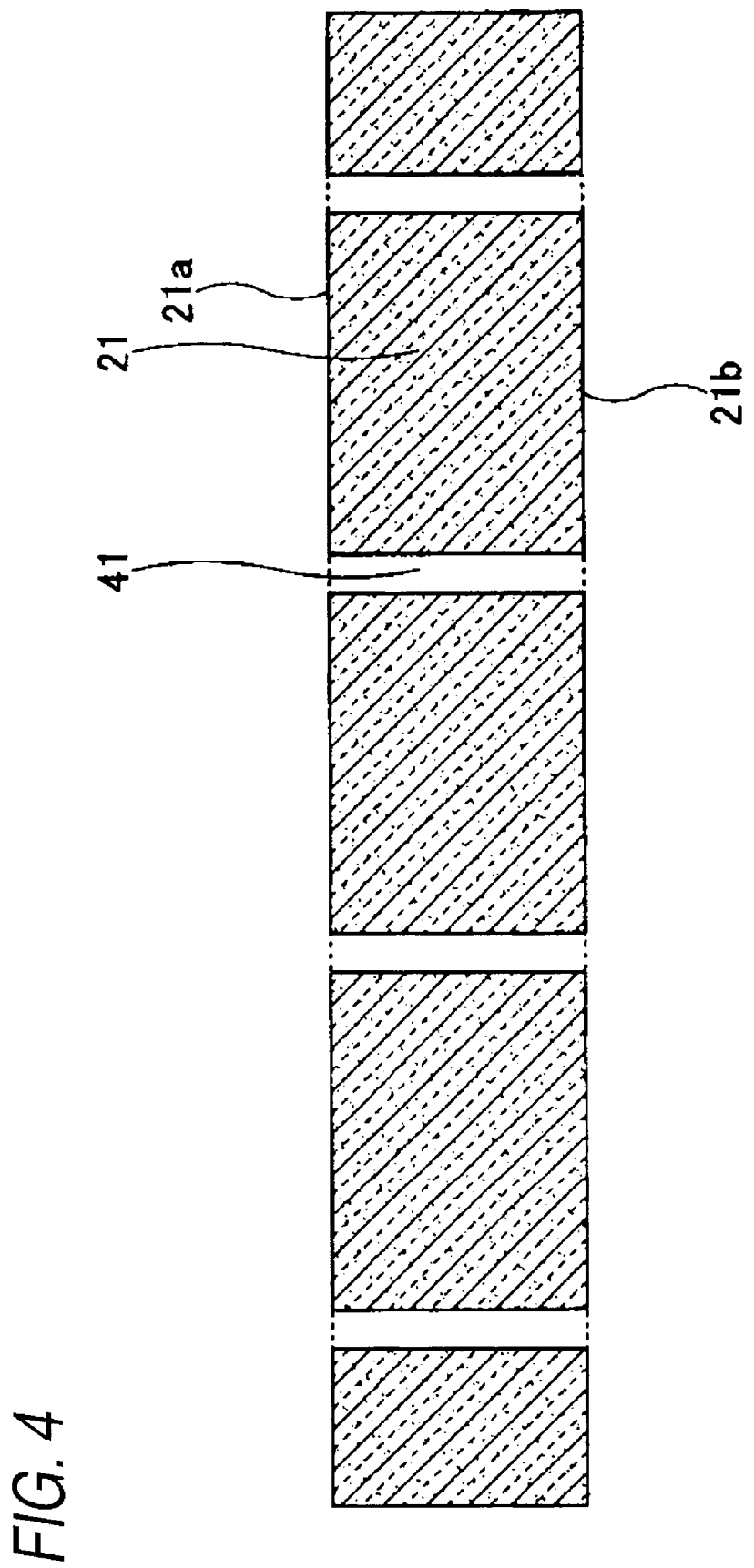
FIG. 4 is a diagram (No. 1) for exemplifying a manufacturing step of the semiconductor package according to the first embodiment mode.

Firstly, in a step shown in FIG. 4, a plurality of through holes (penetration holes) 41 which penetrate a semiconductor chip 21 from an upper plane 21a to a lower plane 21b of the semiconductor chip 21 are formed in the semiconductor chip 21 which constitutes a semiconductor device 20. It should be noted that the thorough holes 41 are formed in a portion of the semiconductor chip 21 where a semiconductor integrated circuit (not shown) is not present. The semiconductor chip 21 is made of, for example, silicon. A thickness of the semiconductor chip 21 may be made as, for example, 300 μm.

In such a case that the semiconductor chip 21 is made of silicon, the through holes 41 may be formed by, for example, an anisotropic etching method (e.g., dry etching). A shape of one through hole 41 is, for example, a circle, as viewed on the plane, and a diameter thereof may be made as, for example, 50 μm. A pitch of the through holes 41 may be made as, for instance, 100 μm. It should be also noted that in the present embodiment mode, the below-mentioned description will be made by exemplifying that the semiconductor chip 21 is constructed of silicon.

Figure 5:
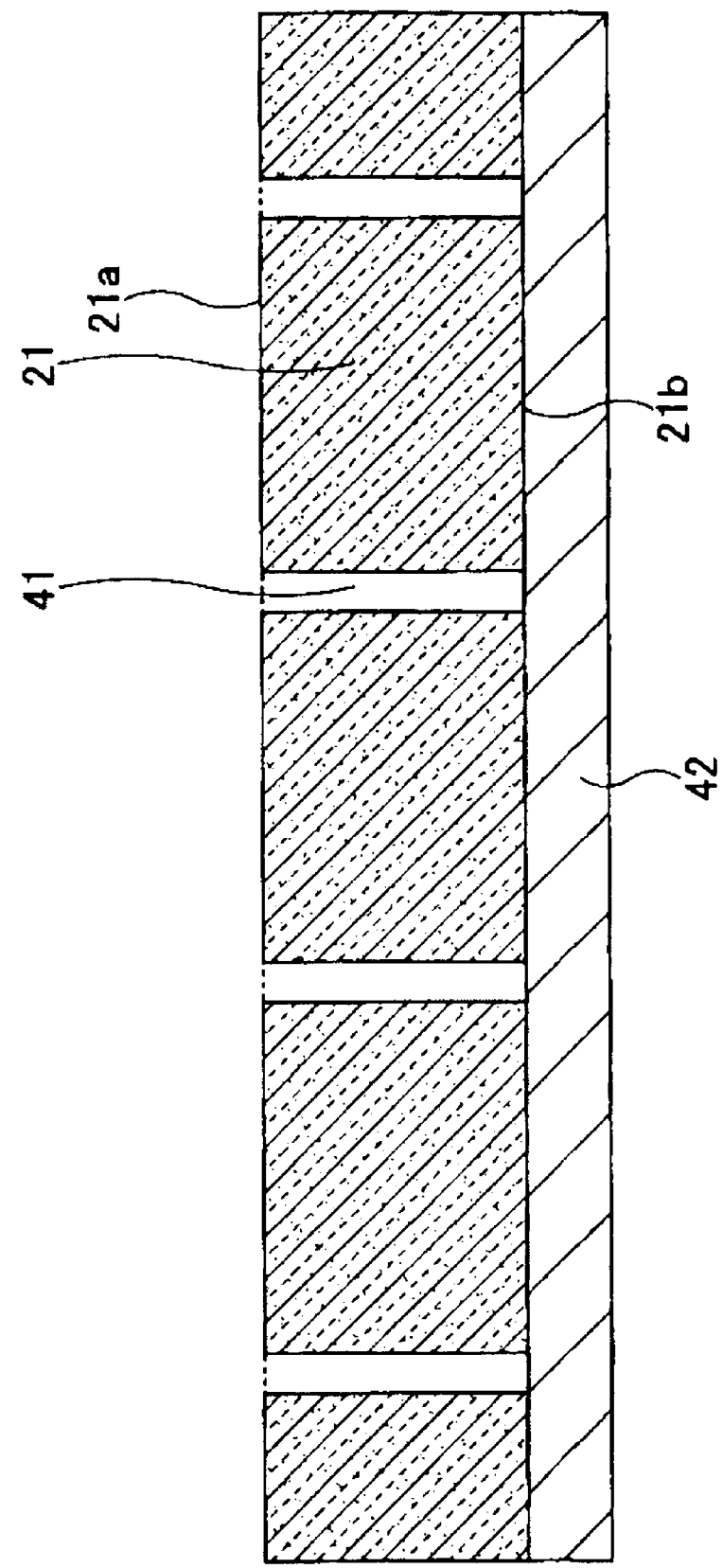
FIG. 5 is a diagram (No. 2) for exemplifying a manufacturing step of the semiconductor package according to the first embodiment mode.

Next, in a step shown in FIG. 5, a metal plate 42 is adhered to the lower plane 21b of the semiconductor chip 21. The metal plate 42 is a member which constitutes a power feeding layer when a penetration portion 24 for constructing a penetration electrode 26 is formed by an electrolytic plating method. As the metal plate 42, for example, a Cu plate may be employed. It should also be noted that in the step shown in FIG. 5, a metal foil may be alternatively adhered to the lower plane 21b of the semiconductor chip 21, instead of the metal plate 42. As the metal foil, for instance, a Cu foil may be employed.

Figure 6:
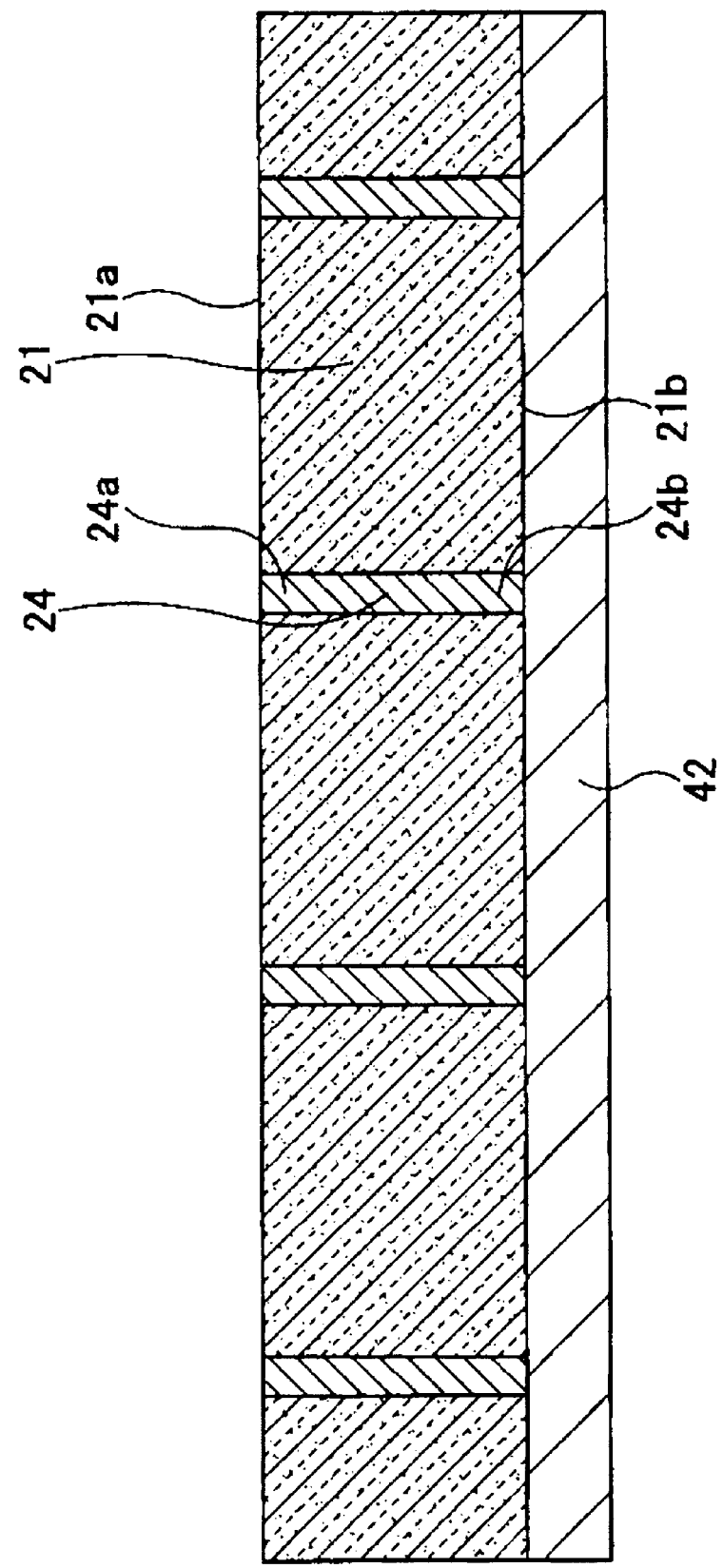
FIG. 6 is a diagram (No. 3) for exemplifying a manufacturing step of the semiconductor package according to the first embodiment mode.

Next, in a step indicated in FIG. 6, a plating film is deposited and grown in such a manner that the through holes 41 are filled based upon an electrolytic plating method using the metal plate 42 as the power feeding layer, in order that the above-described penetration portion 24 is formed. As the plating film for constructing the penetration portion 24, for instance, a Cu plating film may be employed. After the penetration portion 24 is formed, the metal plate 42 is removed.

Figure 7:
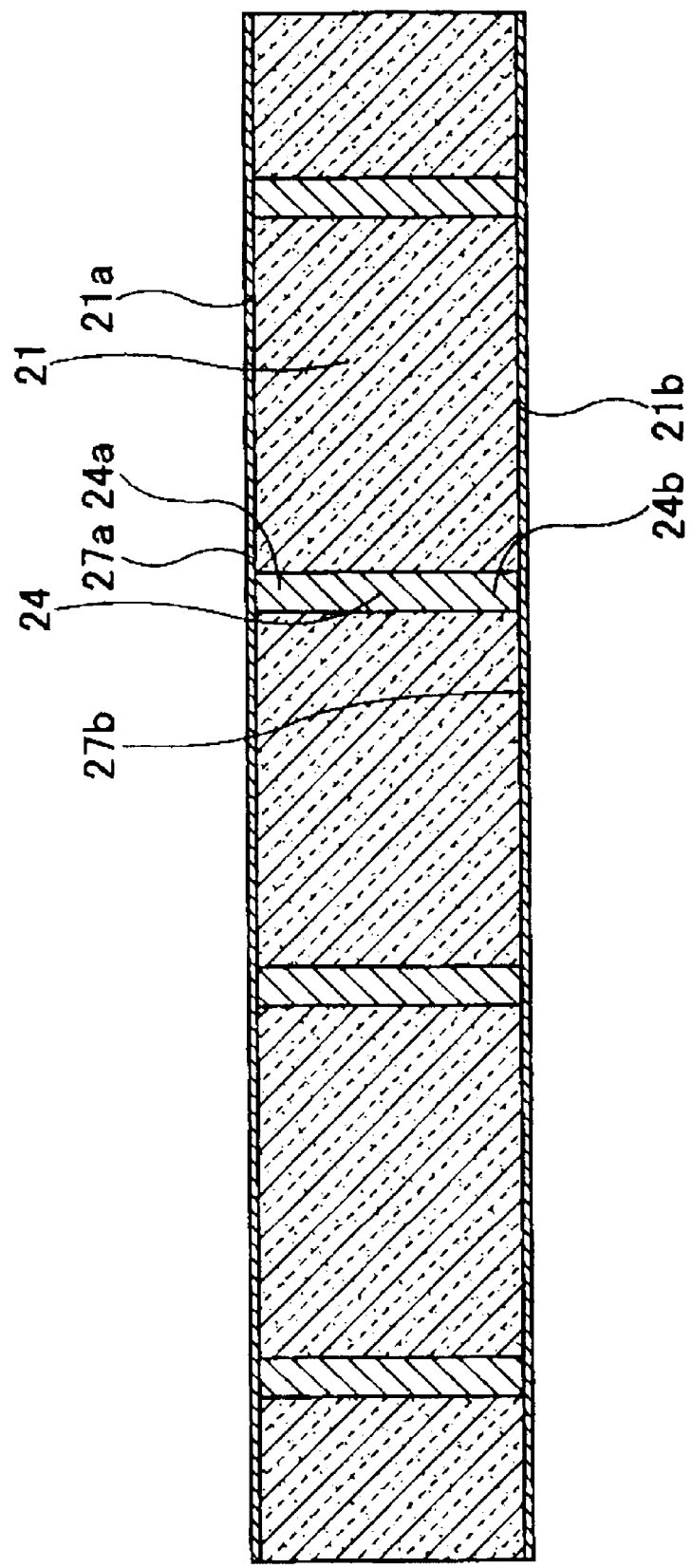
FIG. 7 is a diagram (No. 4) for exemplifying a manufacturing step of the semiconductor package according to the first embodiment mode.

Next, in a step indicated in FIG. 7, a seed layer 27a is formed on the upper plane 21a of the semiconductor chip 21. Also, a seed layer 27b is formed on the lower plane 21b of the semiconductor chip 21. The seed layers 27a and 27b are layers which constitute power feeding layers when plating films 28a and 28b which construct supporting portions 25a and 25b are formed by an electrolytic plating method. The seed layers 27a and 27b may be formed by, for example, a sputtering method, a nonelectrolytic plating method, and the like. As the seed layers 27a and 27b, for example, Cu layers may be employed. In such a case that the Cu layers are employed as the seed layers 27a and 27b, each of thicknesses of the seed layers 27a and 27b may be made as, for instance, 0.3 μm.

Subsequently, in a step shown in FIGS. 8A and 8B (FIG. 3A is sectional view and FIG. 8B is plan view), resist films 44a and 44b are formed in such a manner that the seed layers 27a and 27b are covered. A thickness of the respective resist films 44a and 44b may be made as, for instance, 20 μm. Then, the resist films 44a and 44b are exposed through a mask (not shown), and thereafter, the exposing-processed resist films 44a and 44b are developed so as to form opening portions 44x and 44y in the resist films 44a and 44b. The opening portions 44x and 44y are formed in such a manner that the seed layers 27a and 27b of portions corresponding to the forming regions of the supporting portions 25a and 25b are exposed.

Figure 9:
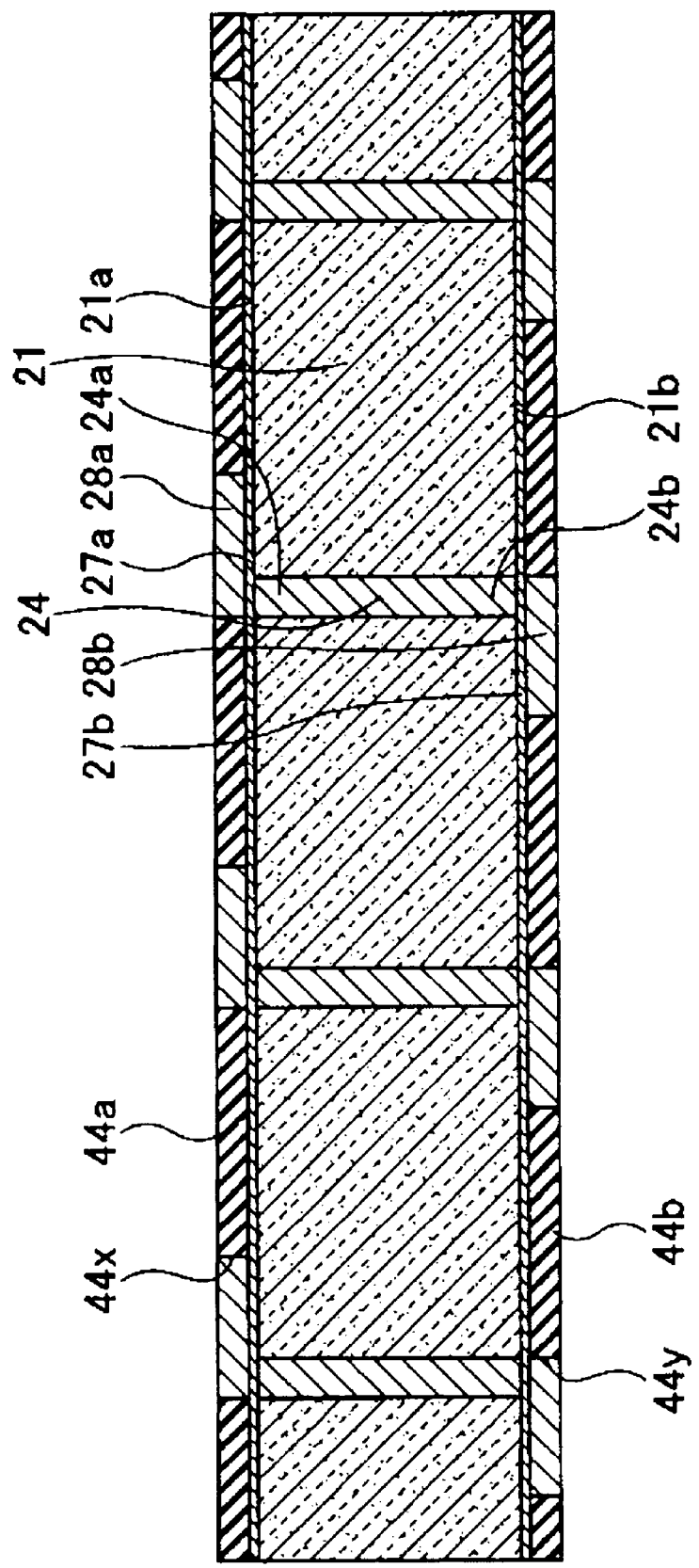
FIG. 9 is a diagram (No. 6) for exemplifying a manufacturing step of the semiconductor package according to the first embodiment mode.

Next, in a step indicated in FIG. 9, a plating film 28a is deposited and grown which fills the opening portion 44x based upon an electrolytic plating method using the seed layer 27a as a power feeding layer. Also, a plating film 28b is deposited and grown which fills the opening portion 44y based upon an electrolytic plating method using the seed layer 27b as a power feeding layer. The plating films 28a and 28b are films which constitute one of the structural elements of the supporting portions 25a and 25b. As the plating films 28a and 28b, for instance, a Cu plating film may be employed. A thickness of the respective plating films 28a and 28b may be made as, for example, 10 μm.

Figure 10:
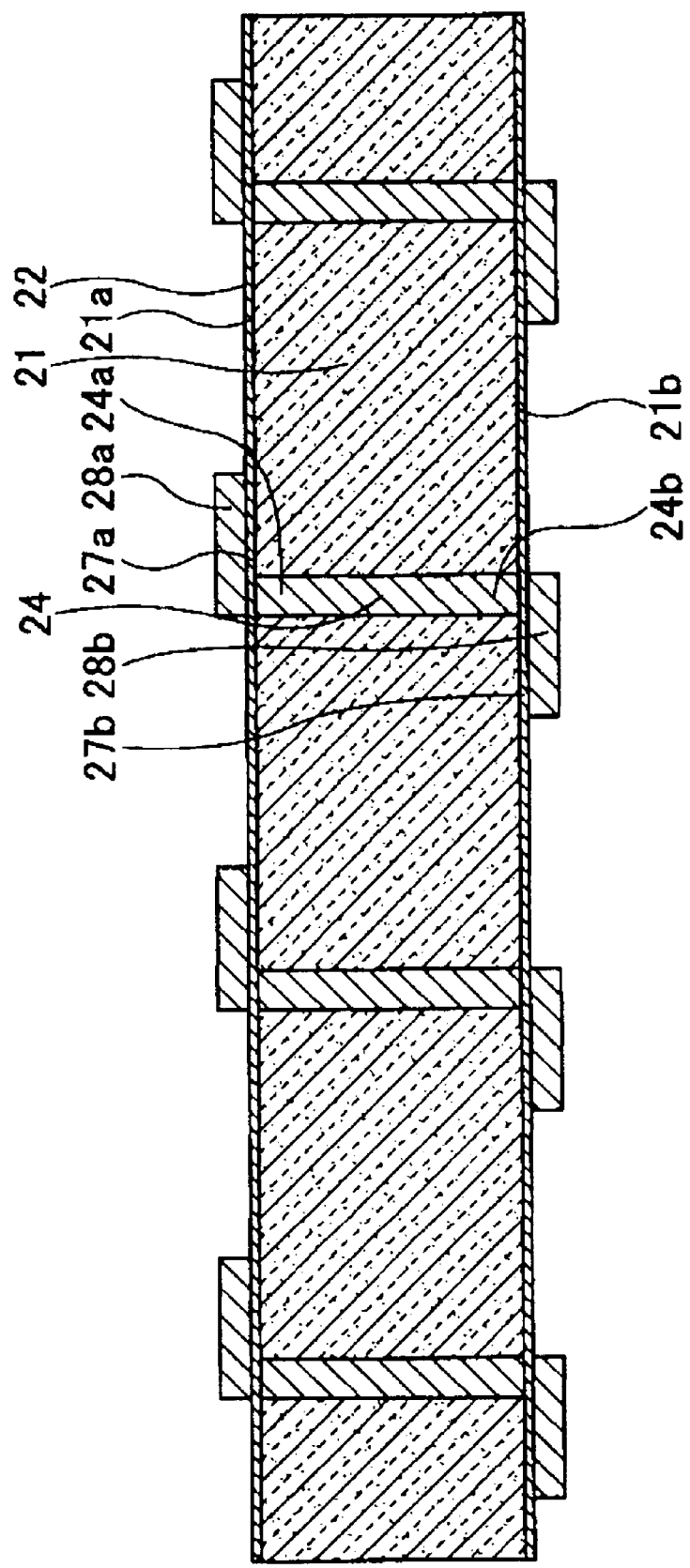
FIG. 10 is a diagram (No. 7) for exemplifying a manufacturing step of the semi conductor package according to the first embodiment mode.
Figure 11:
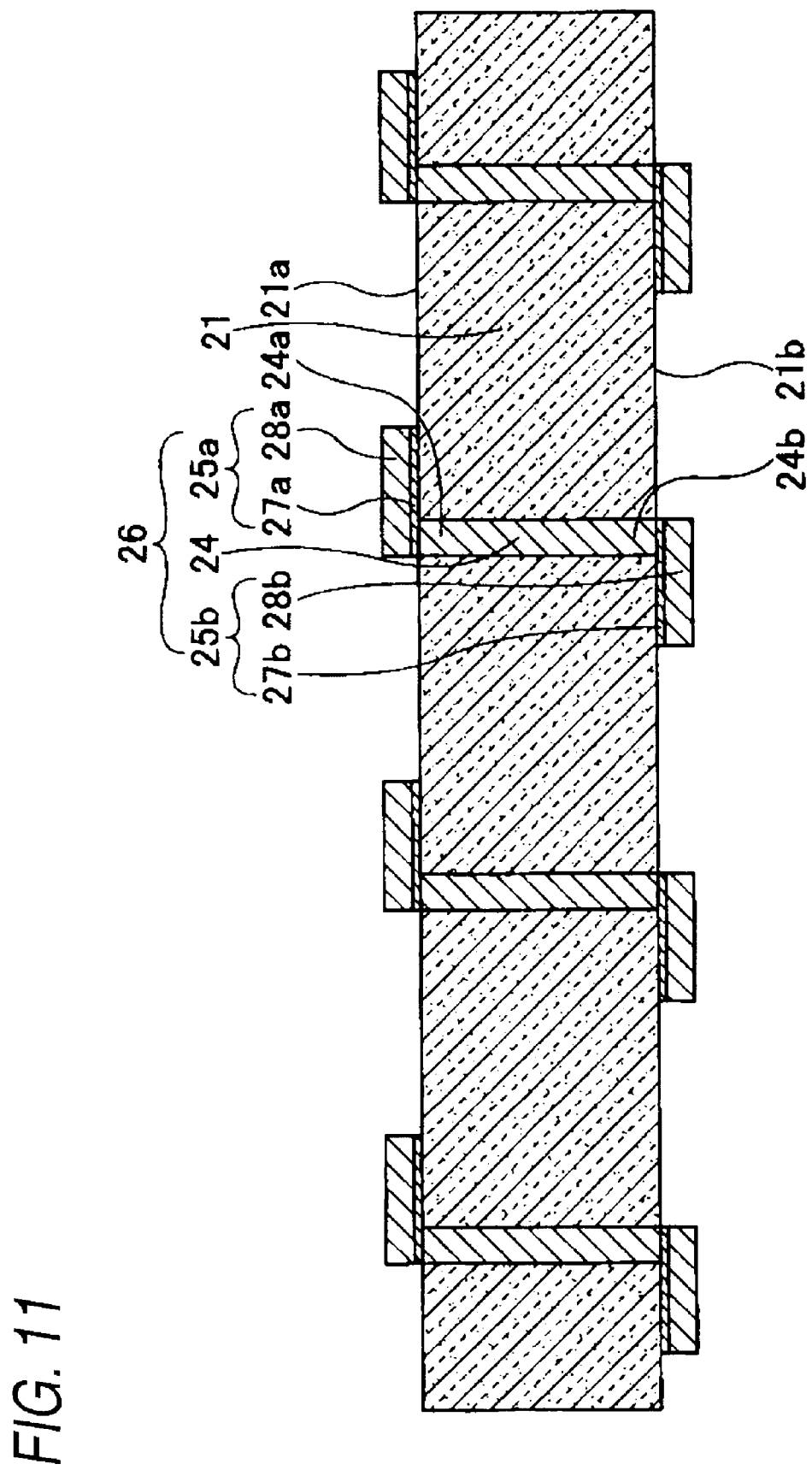
FIG. 11 is a diagram (No. 8) for exemplifying a manufacturing step of the semiconductor package according to the first embodiment mode.

Next, in a step shown in FIG. 10, the resist films 44a and 44b indicated in FIG. 9 are removed. The resist films 44a and 44b are removed by, for instance, etching. Subsequently, in a step indicated in FIG. 11, the seed layers 27a and 27b of an unnecessary portion which is not covered by the plating films 28a and 28b are removed. The seed layers 27a and 27b of the unnecessary portion are removed by, for instance, etching. As a result, supporting portions 25a and 25b are formed which are equipped with the seed layers 27a and 27b, and the plating films 28a and 28b. Also, a penetration electrode 26 is formed which is equipped with the penetration portion 24 and the supporting portions 25a and 25b.

Figures 12A, 12B:
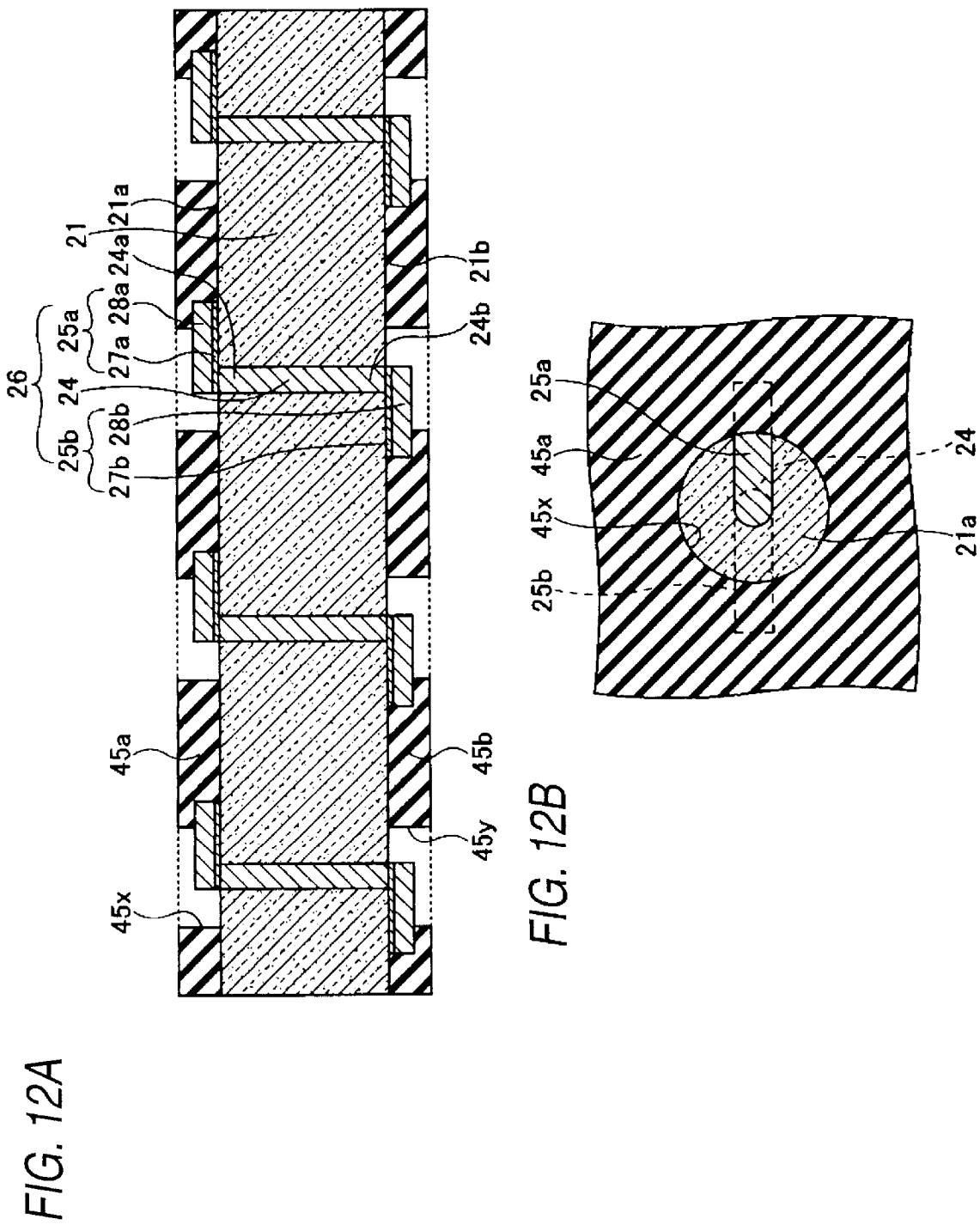
FIGS. 12A and 12B are diagrams (No. 9) for exemplifying a manufacturing step of the semiconductor package according to the first embodiment mode.

Next, in a step represented in FIGS. 12A and 12B (FIG. 12A is sectional view, and FIG. 12B is plan view), resist films 45a and 45b are formed in such a manner that the upper plane 21a of the semiconductor chip 21, the supporting portion 25a, the lower plane 21b of the semiconductor chip 21, and the supporting portion 25b are covered. A thickness of the respective resist films 45a and 45b may be made as, for example, 30 μm.

Then, the resist films 45a and 45b are exposed through a mask (not shown), and thereafter, the exposing-processed resist films 45a and 45b are developed in order that opening portions 45x and 45y are formed in the resist films 45a and 45b. The opening portions 45x and 45y are formed in such a manner that the upper plane 21a and the lower plane 21b of the semiconductor chip 21 of portions corresponding to a forming region of space portions 23a and 23b are exposed. A shape of the respective opening portions 45x and 45y is, for instance, a circle, as viewed on the plane, and a diameter thereof may be made as, for instance, 50 μm.

Next, in a step shown in FIGS. 13A and 13B (FIG. 13A is sectional view and FIG. 13B is plan view), a space portion 23a is formed at a peripheral portion of the penetration portion 24 except for a portion covered by the supporting portion 25a, as viewed on the plane. The space portion 23a may be formed by performing, for instance, anisotropic etching (e.g., dry etching) the semiconductor chip 21 from the upper plane 21a of the semiconductor chip 21.

Figure 14:
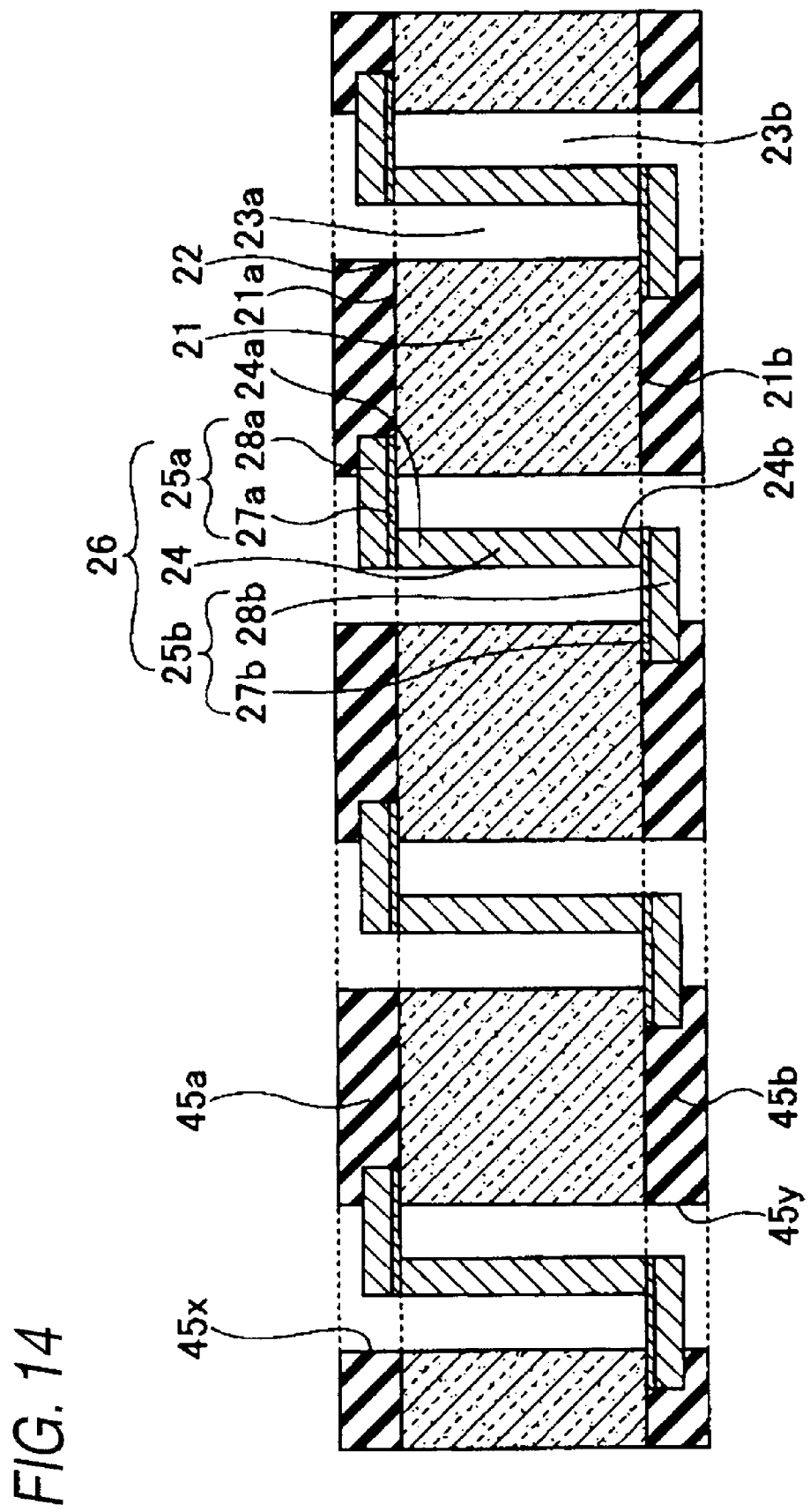
FIG. 14 is a diagram (No. 11) for exemplifying a manufacturing step of the semiconductor package according to the first embodiment mode.

Next, in a step shown in FIG. 14, another space portion 23b is formed in the vicinity of the penetration portion 24. The space portion 23b corresponds to the portion which could not be removed in the step indicated in FIGS. 13A and 13B and is covered by the supporting portion 25a, as viewed on the plane. The space portion 23b may be formed by performing, for example, anisotoropic etching (e.g., dry etching) the semiconductor chip 21 from the lower plane 21b of the semiconductor chip 21. As a result, the space portions 23a and 23b are formed at the peripheral portion of the penetration portion 24 in such a manner that the entire side plane of the penetration portion 24 is exposed, and the penetration portion 24 penetrates the semiconductor chip 21 without contacting with the semiconductor chip 21.

Figure 15:
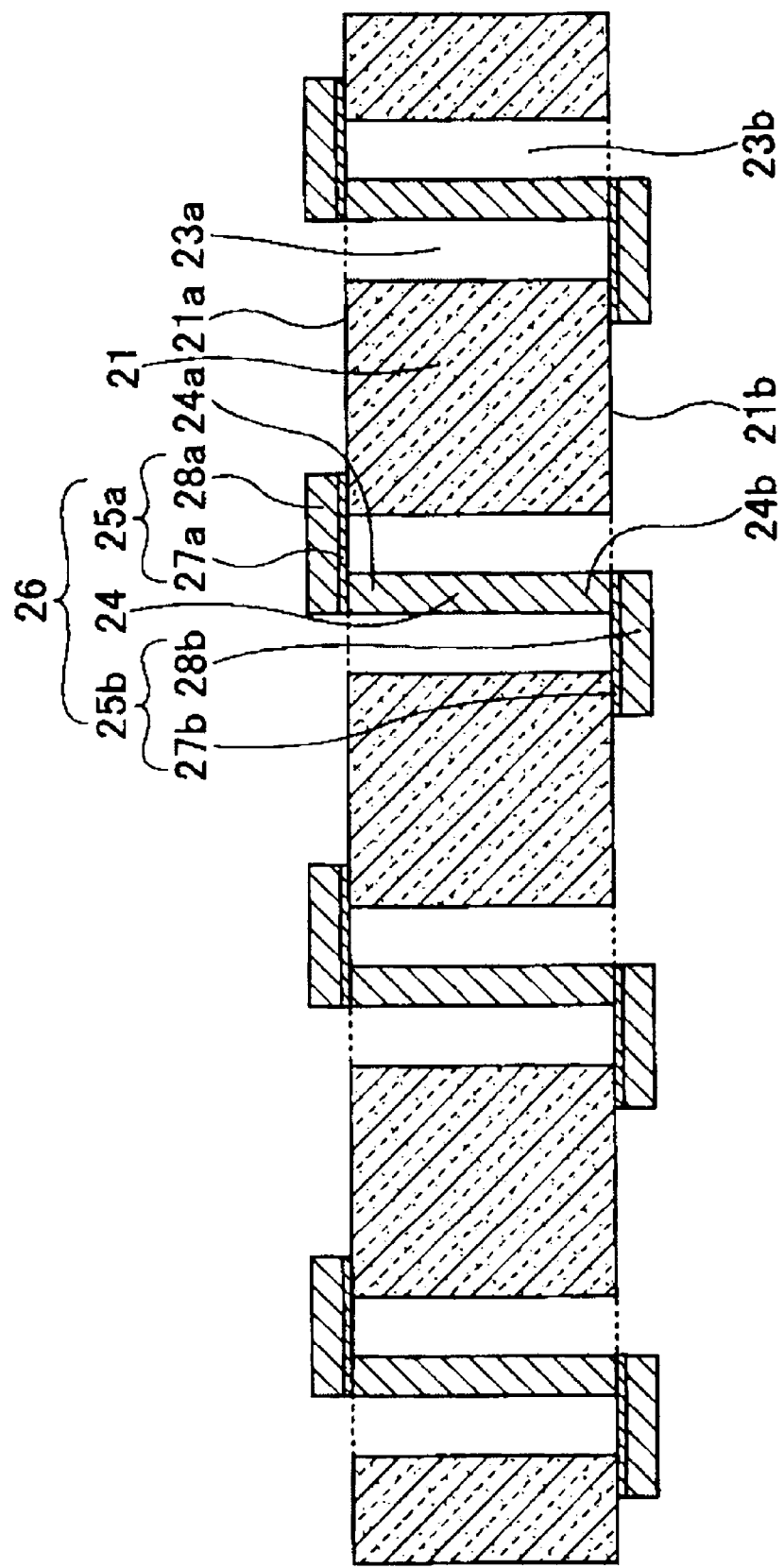
FIG. 15 is a diagram (No. 12) for exemplifying a manufacturing step of the semiconductor package according to the first embodiment mode.
Figure 16:
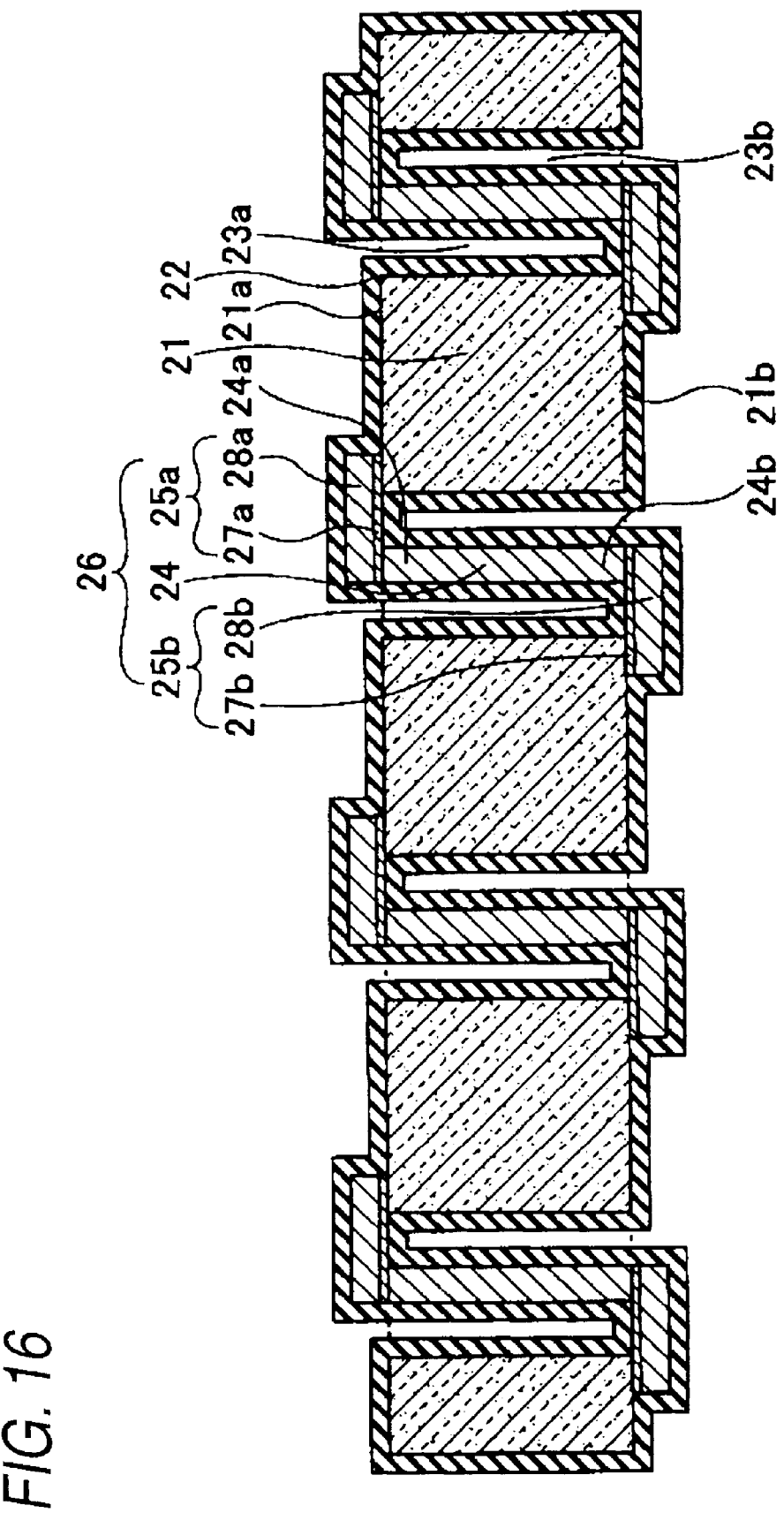
FIG. 16 is a diagram (No. 13) for exemplifying a manufacturing step of the semiconductor package according to the first embodiment mode.

Next, in a step shown in FIG. 15, the resist films 45a and 45b represented in FIG. 14 are removed. The resist films 45a and 45b are removed by, for example, etching. Next, in a step shown in FIG. 16, an insulating film 22 is formed which covers an entire surface (which also contains wall planes of semiconductor chip 21 of portions corresponding to space portions 23a and 23b) of the semiconductor chip 21, and an entire surface of the penetration electrode 26. As the insulating film 22, for example, $SiO_2$ may be employed. The insulating film 22 may be formed by, for instance, a CVD method. A thickness of the insulating film 22 may be made as, for instance, 0.5 μm to 1.0 μm.

Figure 17:
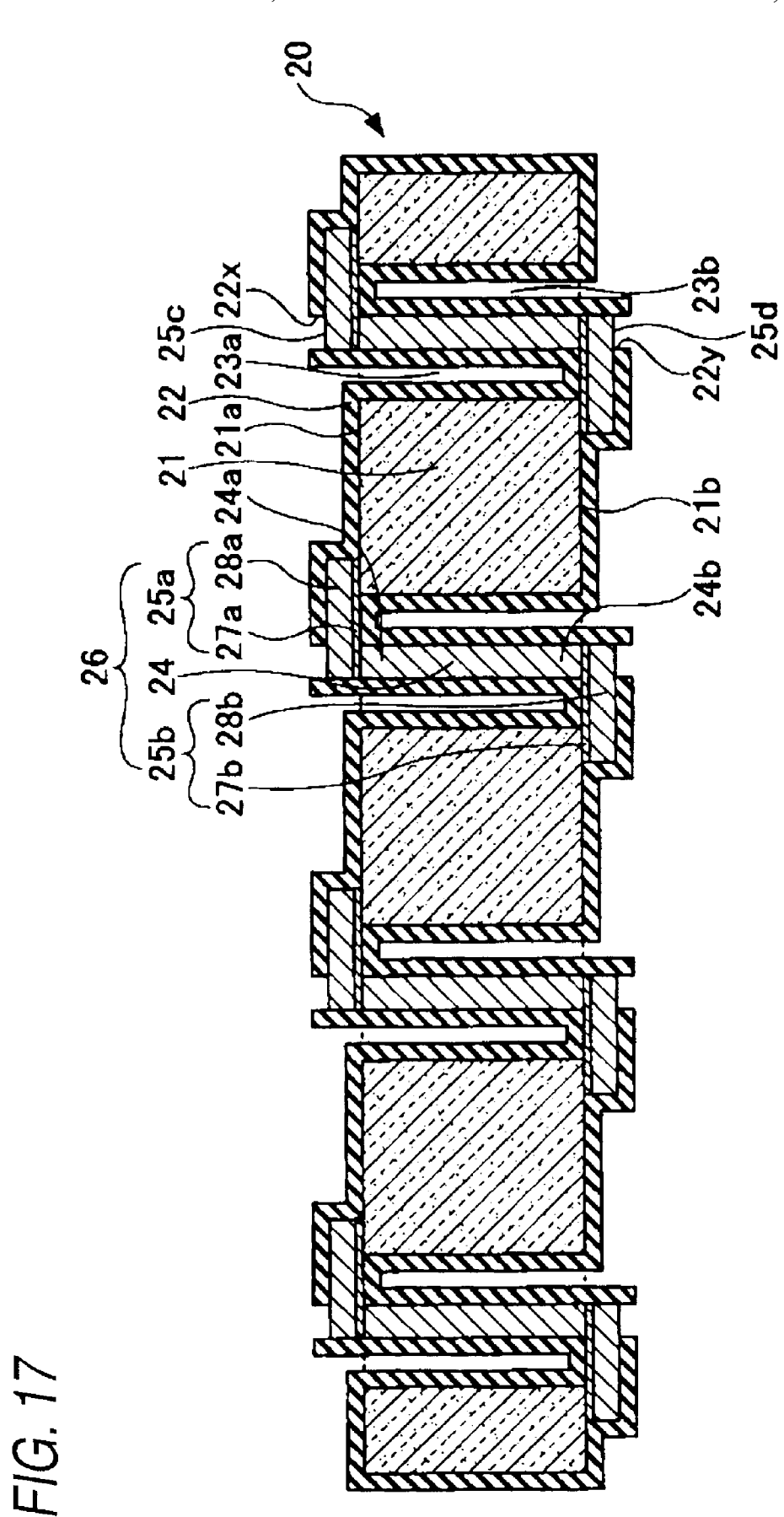
FIG. 17 is a diagram (No. 14) for exemplifying a manufacturing step of the semiconductor package according to the first embodiment mode.

Next, in a step indicated in FIG. 17, only an insulating film 22 formed on a portion of the upper plane 25c of the supporting portion 25a, which is overlapped with the penetration portion 24, as viewed on the plane, is removed so as to form an opening portion 22x. Also, only another insulating film 22 formed on a portion of the lower plane 25d of the supporting portion 25b, which is overlapped with the penetration portion 24, as viewed on the plane, is removed so as to form another opening portion 22y. The opening portions 22x and 22y may be formed by that, for example, a resist film for opening only portions which are to be removed is formed and then the formed resist film is removed by an isotropic etching method (e.g., dry etching). As a result, both the portion of the upper plane 25c of the supporting portion 25a, which is overlapped with the penetration portion 24, as viewed on the plane, and the portion of the lower plane 25d of the supporting portion 25b, which is overlapped with the penetration portion 24, as viewed on the plane, function as electrode pads when these portions are electrically connected to a wiring board, a semiconductor device, and the like.

Figure 18:
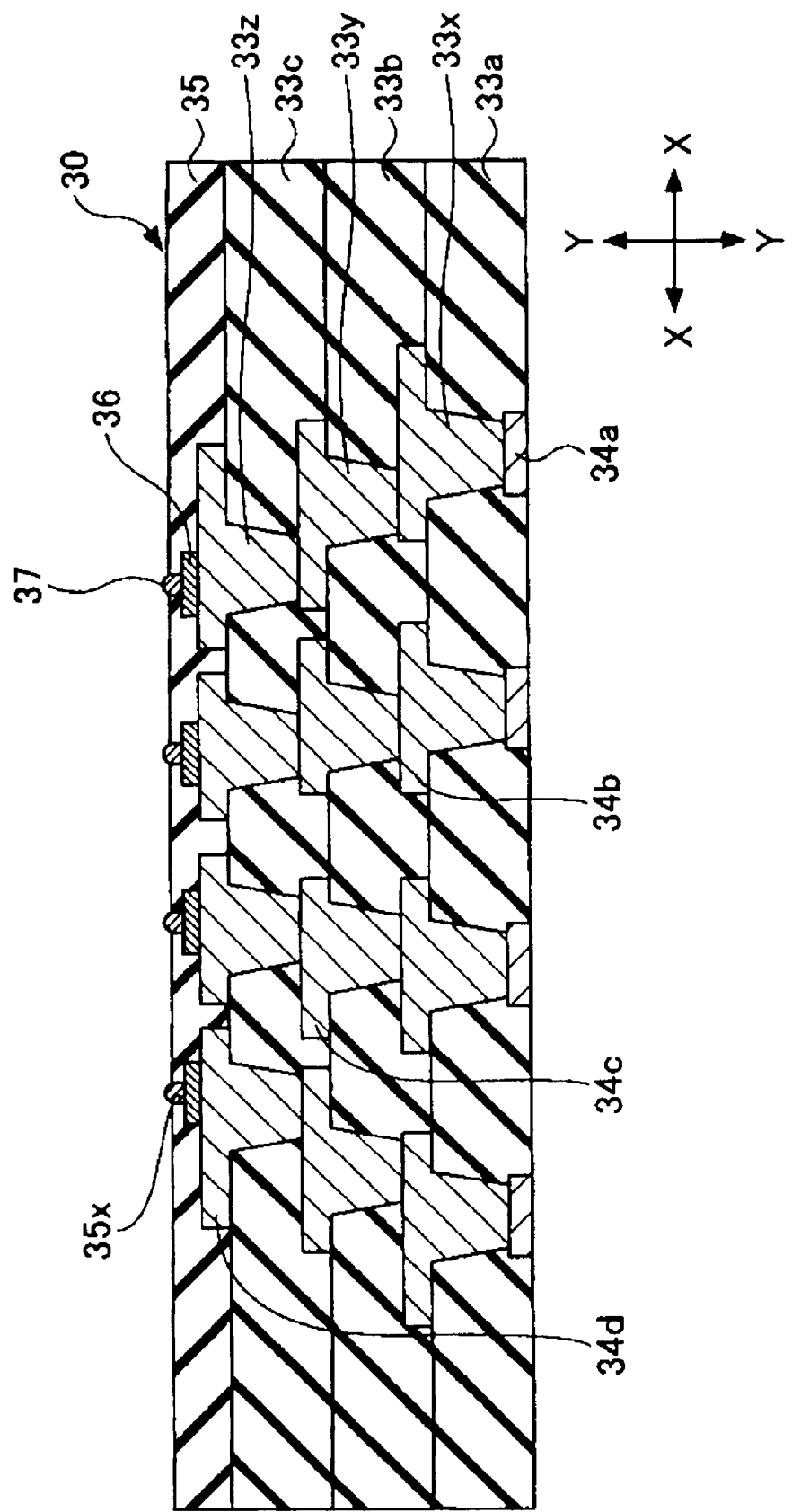
FIG. 18 is a diagram (No. 15) for exemplifying a manufacturing step of the semiconductor package according to the first embodiment mode.

Next, in a step shown in FIG. 18, a wiring board 30 is prepared. Pre-solder 37 is formed on a metal layer 36 of the wiring board 30. The pre-solder 37 is obtained by coating, for instance, solder paste on the metal layer 36 and by reflow-processing the paste-coated metal layer 36. As a material of the solder paste, for instance, an alloy containing Pb, an alloy made of Sn and Cu, an alloy made of Sn and Ag, an alloy made of Sn, Ag, and Cu, and the like may be employed. It should also be understood that since the method for manufacturing the wiring board 30 is well known in the technical field, a description thereof is omitted.

Figure 19:
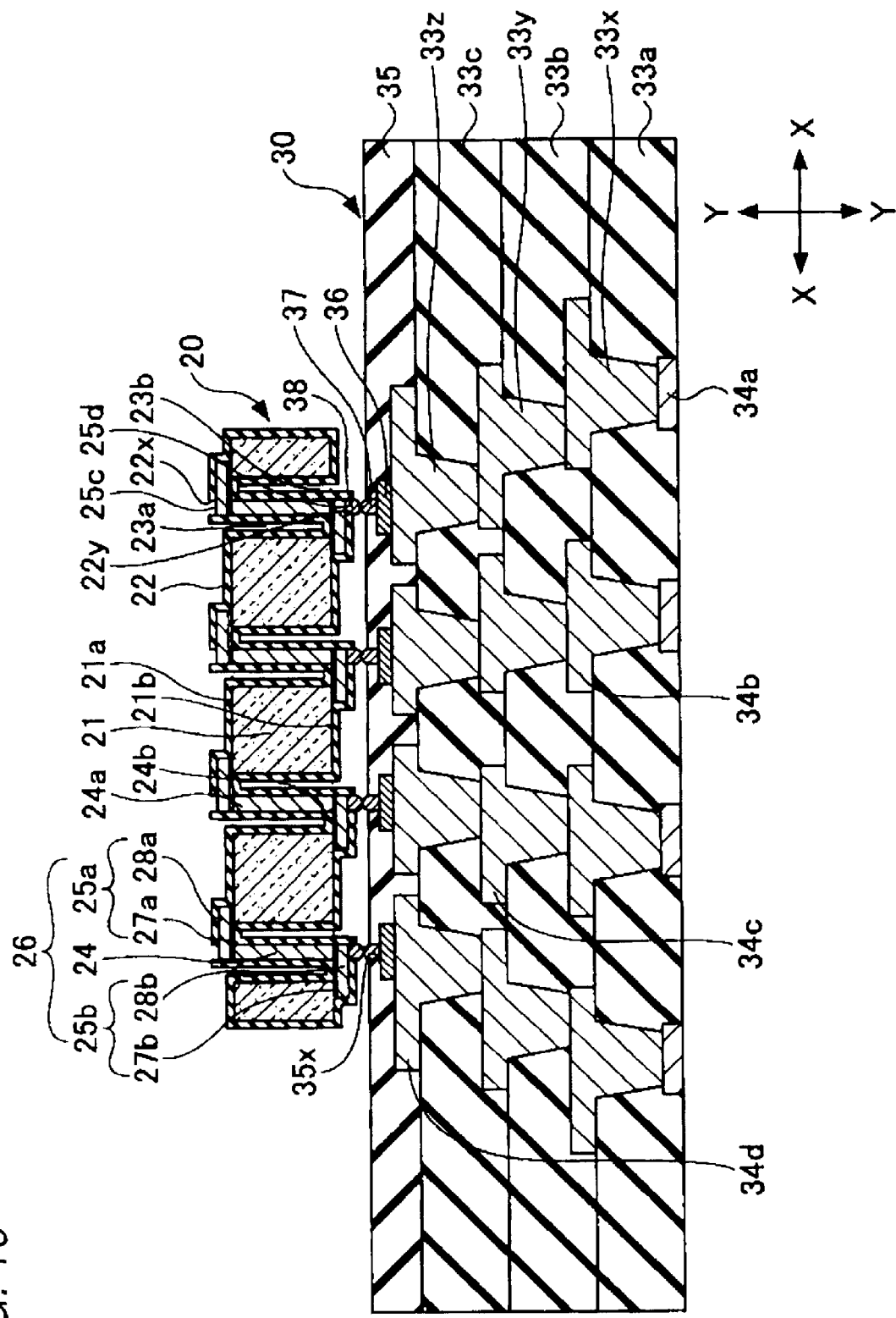
FIG. 19 is a diagram (No. 16) for exemplifying a manufacturing step of the semiconductor package according to the first embodiment mode.

Next, in a step shown in FIG. 19, pre-solder 38 is formed on the lower plane 25d of the supporting portion 25b which is exposed within the opening portion 22y. The pre-solder 38 is obtained by coating, for example, solder paste on the lower plane 25d of the supporting portion 25b which is exposed within the opening portion 22y, and by reflow-processing the paste-coated lower plane 25d. As a material of the solder paste, for instance, an alloy containing Pb, an alloy made of Sn and Cu, an alloy made of Sn and Ag, an alloy made of Sn, Ag, and Cu, and the like may be employed. Then, the semiconductor device 20 is arranged on the wiring board 30 in such a manner that the pre-solder 37 is located opposite to the pre-solder 38.

Next, in the structural body represented in FIG. 19, the pre-solder 37 and the pre-solder 38 are heated at a temperature of, for example, 230° C. so as to melt the solder. As a result, both the pre-solder 37 and the pre-solder 38 are melt to become an alloy, so that a single bump is formed to become a joining portion 40 shown in FIG. 2. As a consequence, the semiconductor device 20 is electrically and mechanically connected via the joining portion 40 to the wiring board 30, so that a semiconductor package 10 indicated in FIG. 2 is manufactured.

In accordance with the semiconductor package 10 related to the first embodiment mode, the semiconductor device 20 is electrically connected to the wiring board 30 via the joining portion 40 provided on the penetration electrode 26 of the semiconductor device 20. The penetration electrode 26 has such a structure that the penetration portion 24 is supported by the supporting portions 25a and 25b under movable condition along the X-X direction and the Y-Y direction. As a result, even in such a case that heat is applied to the semiconductor package 10, stresses produced in the joining portion 40 can be considerably relaxed, which are caused by the difference in the thermal expansion coefficients of the semiconductor device 20 and the wiring board 30, and thus, it is possible to avoid that a crack occurs in the joining portion 40.

<Second Embodiment Mode>
[Structure of Semiconductor Package Related to Second Embodiment Mode]

Figure 20:
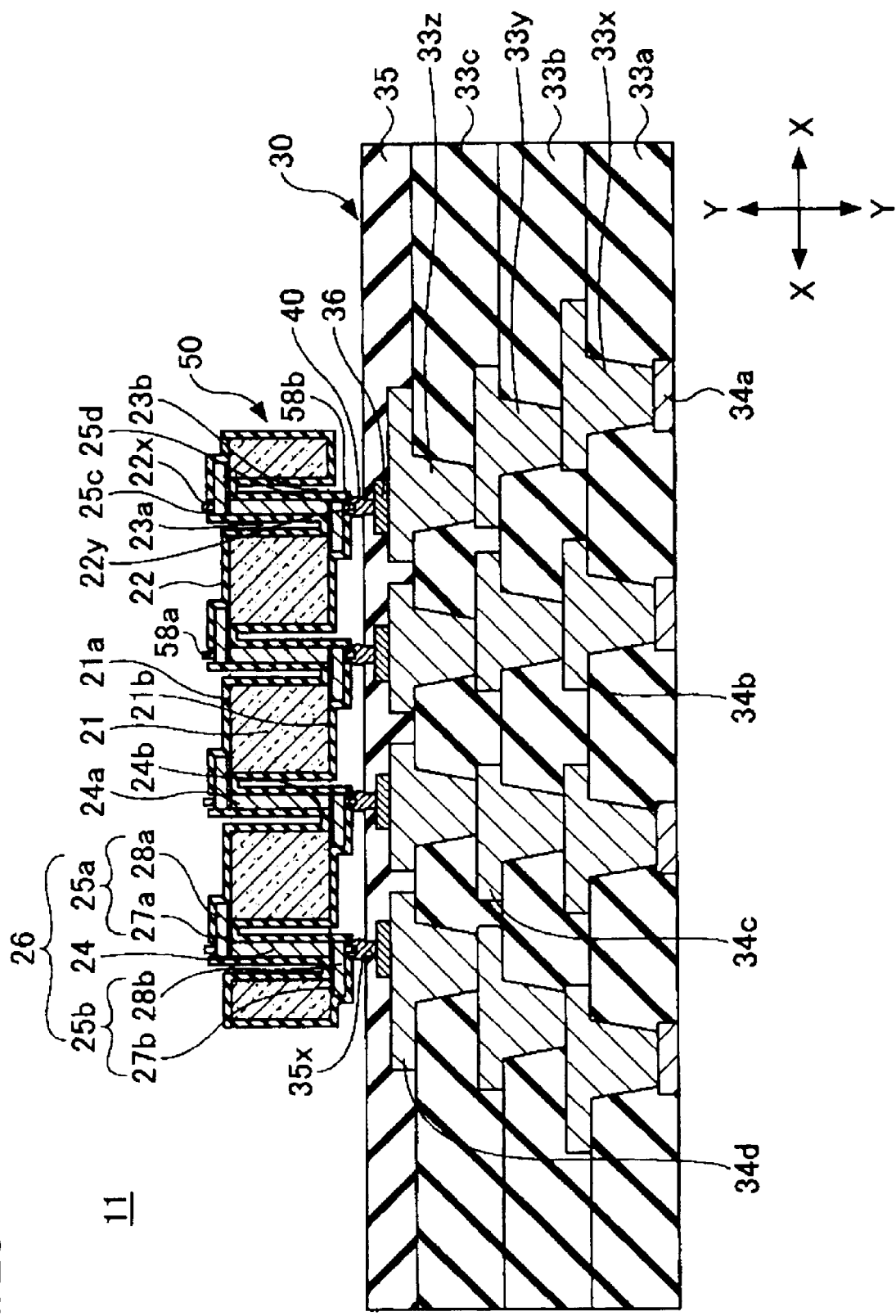
FIG. 20 is a diagram for exemplifying a semiconductor package according to a second embodiment mode of the present invention.
Figure 21:
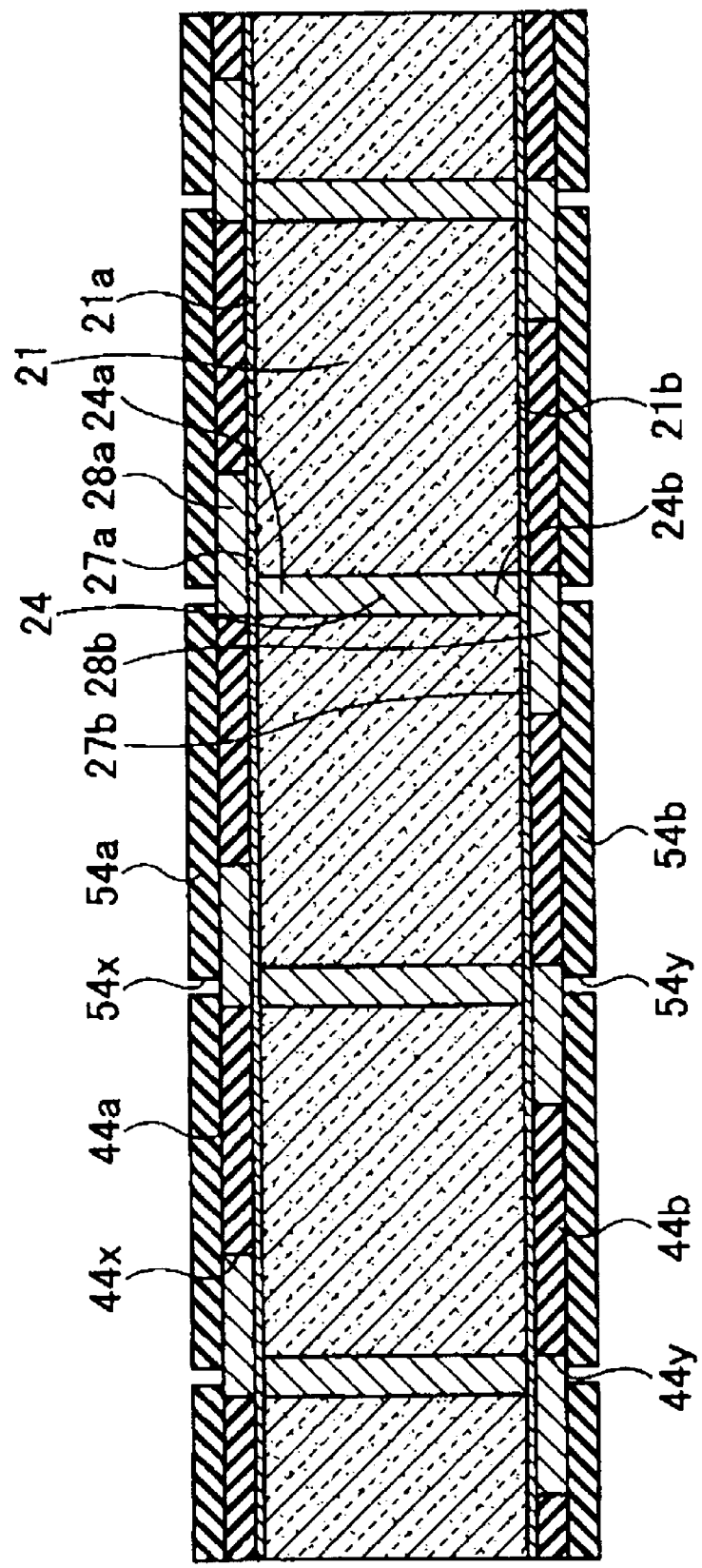
FIG. 21 is a diagram (No. 1) for exemplifying a manufacturing step of the semiconductor package according to the second embodiment mode.

Firstly, a description is made of a structure of a semiconductor package according to a second embodiment mode of the present invention. FIG. 20 is a diagram for exemplifying the semiconductor package according to the second embodiment mode. In FIG. 20, an X-X direction indicates a plane direction which is parallel to the upper plane 21a of the semiconductor chip 21 and a Y-Y direction indicates a direction perpendicular to the X-X direction. In FIG. 20, the same reference numerals will be given to the Same structural portions of FIG. 2, and descriptions thereof will be sometimes omitted.

Referring to FIG. 20, a semiconductor package 11 according to the second embodiment mode is constructed in a similar manner to that of the semiconductor package 10 shown in FIG. 2 except that the semiconductor device is replaced by a semiconductor device 50. The semiconductor device 50 is constructed in a similar manner to that of the semiconductor device 20 shown in FIG. 2 except that projection portions 58a and 58b are additionally provided. A description is made of only a different structural portion from that of the semiconductor device 20 with respect to the semiconductor device 50.

In the semiconductor device 50, the projection portion 58a is formed on the upper plane 25c of the supporting portion 25a, which is exposed within the opening portion 22x. Also, the projection portion 58b is formed on the lower plane 25d of the supporting portion 25b, which is exposed within the opening portion 22y. The projection portions 58a and 58b are made of a material having electric conductivity, and correspond to one of the structural elements of the penetration electrode 26. A shape of the respective projection portions 58a and 58b is, for example, a circle, as viewed on the plane, and a diameter thereof may be made as, for instance, 20 μm. A thickness of the respective projection portions 58a and 58b may be made as, for instance, 20 μm. As a material of the projection portions 58a and 58b, for example, Cu may be employed.

As previously described, since the projection portion 58a is provided on the upper plane 25c of the supporting portion 25a and the projection portion 58b is provided on the lower plane 25d of the supporting portion 25b, the below-mentioned effects may be achieved: That is, connections between upper and lower portions may be easily made when an interposer (not shown) is mounted on a substrate, and interposers are stacked thereon with each other.

[Manufacturing Method of Semiconductor Package Related to Second Embodiment Mode]

Subsequently, a description is made of a method for manufacturing a semiconductor package, according to a second embodiment mode of the present invention. FIGS. 21 to 24 are diagrams for exemplifying manufacturing steps of the semiconductor package 11, related to the second embodiment mode. In FIGS. 21 to 24, the same reference numerals will be employed as those for denoting the same structural portions indicated in FIGS. 3 to 19, and explanations thereof will be sometimes omitted. It should be noted that since the manufacturing method of the portions except for those of the semiconductor device 50 is similar to that of the first embodiment mode, only a method for manufacturing the semiconductor device 50 will be explained.

In the beginning, steps similar to those of FIGS. 3 to 9 of the first embodiment mode are performed. Next, in a step shown in FIG. 21, a resist film 54a is formed in such a manner that the plating film 28a and the resist film 44a are covered. Also, a resist film 54b is formed in such a manner that the plating film 28b and the resist film 44b are covered. A thickness of the respective resist films 54a and 54b may be made as, for instance, 20 μm. Then, the resist films 54a and 54b are exposed through a mask (not shown), and thereafter, the exposing-processed resist films 54a and 54b are developed so as to form opening portions 54x and 54y in the resist films 54a and 54b. The opening portions 54x and 54y are formed in portions of both the upper plane 25c of the supporting portion 25a and the lower plane 25d of the supporting portion 25b, which are overlapped with the penetration portion 24, as viewed on the plane. A shape of the respective opening portions 54x and 54y is, for instance, a circle, as viewed on the plane, and a diameter thereof may be made as, for instance, 20 μm.

Figure 22:
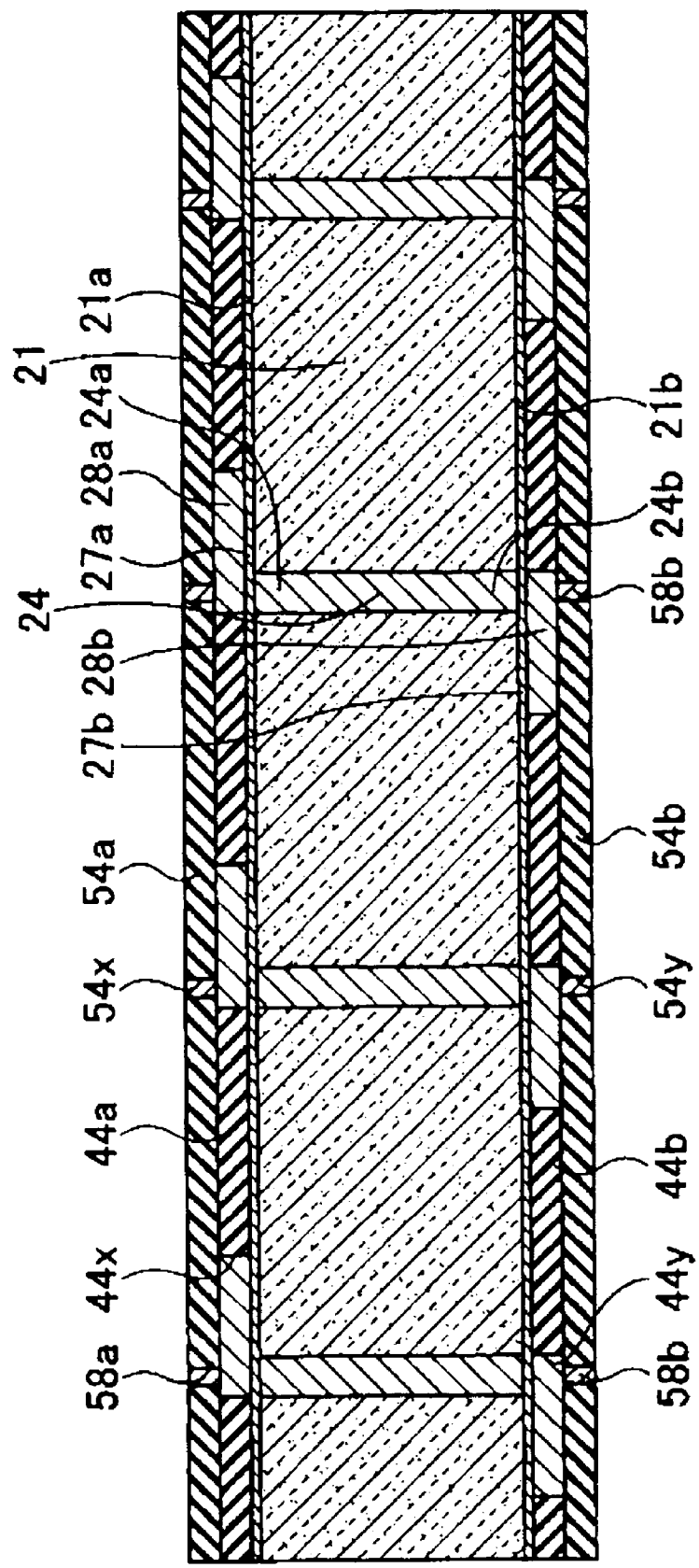
FIG. 22 is a diagram (No. 2) for exemplifying a manufacturing step of the semiconductor package according to the second embodiment mode.

Next, in a step indicated in FIG. 22, a plating film is deposited and grown which fills the opening portion 54x based upon an electrolytic plating method using the plating film 28a as a power feeding layer so as to form a projection portion 58a. Also, a plating film is deposited and grown which fills the opening portion 54y based upon an electrolytic plating method using the plating film 28b as a power feeding layer so as to form a projection portion 58b. The projection portions 58a and 58b are films which constitute one of the structural elements of the projection electrode 26. As the projection 58a and 58b, for instance, a Cu plating film may be employed. A thickness of the respective projection portions 58a and 58b may be made as, for example, 20 μm.

Figure 23:
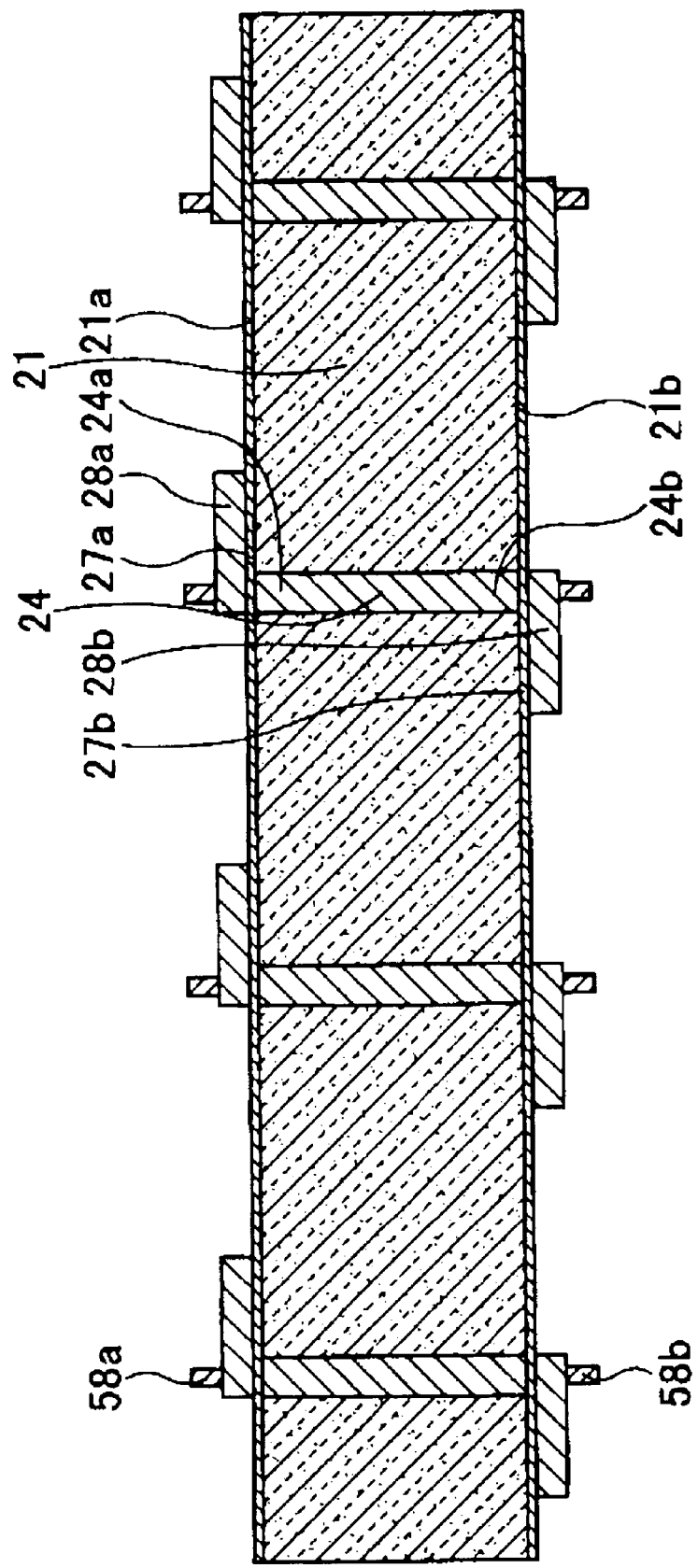
FIG. 23 is a diagram (No. 3) for exemplifying a manufacturing step of the semiconductor package according to the second embodiment mode.
Figure 24:
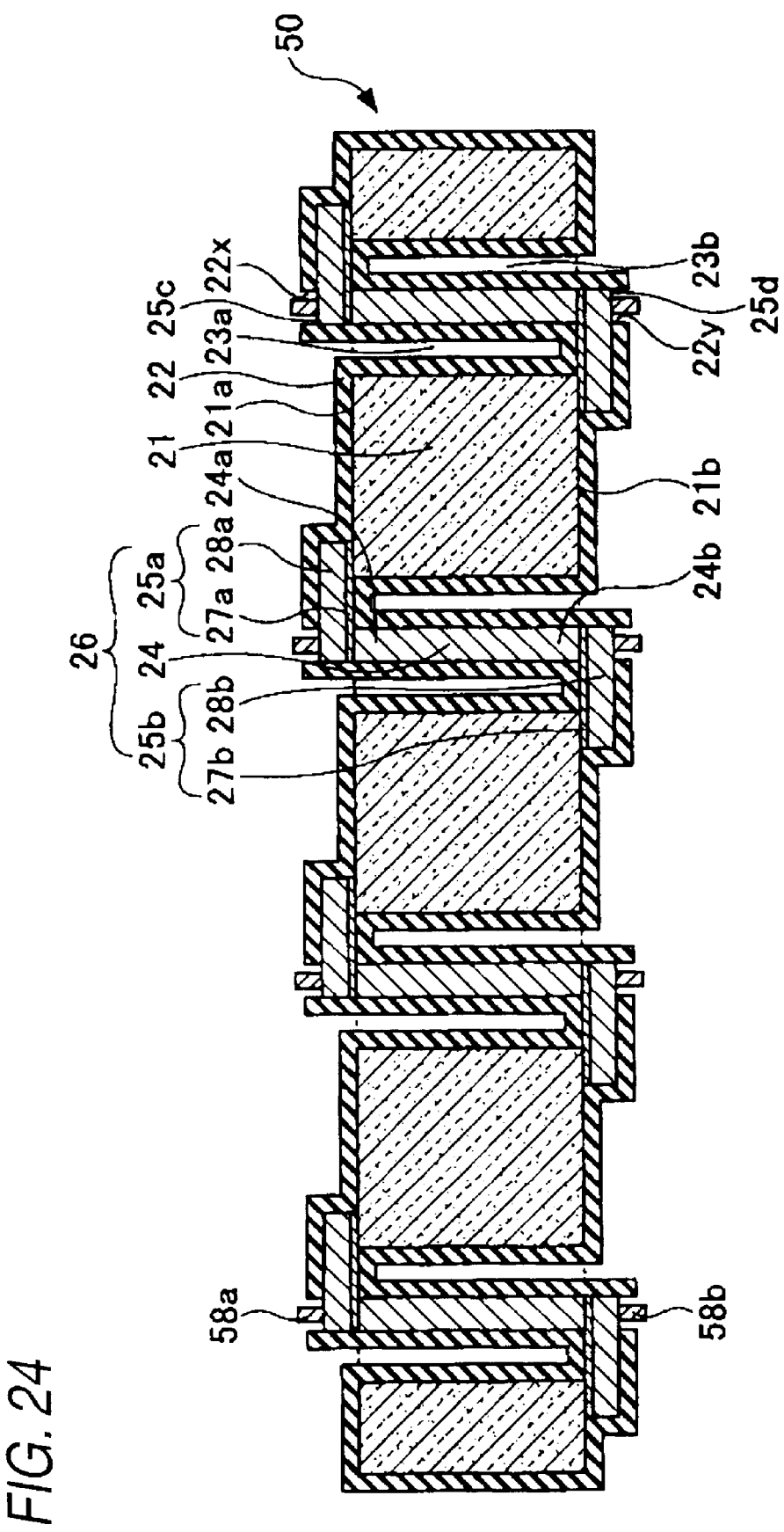
FIG. 24 is a diagram (No. 4) for exemplifying a manufacturing step of the semiconductor package according to the second embodiment mode.

Next, in a step shown in FIG. 23, the resist films 54a and 54b indicated in FIG. 22 are removed. The resist films 54a and 54b are removed by, for instance, etching. Subsequently, steps similar to those of FIGS. 12A to 16 of the first embodiment mode are carried out. Next, in a step indicated in FIG. 24, only an insulating film 22 formed on a portion of the upper plane 25c of the supporting portion 25a, which is overlapped with the penetration portion 24, as viewed on the plane, is removed so as to form an opening portion 22x. Also, only another insulating film 22 formed on a portion of the lower plane 25d of the supporting portion 25b, which is overlapped with the penetration portion 24, as viewed on the plane, is removed so as to form another opening portion 22y. The opening portions 22x and 22y may be formed by that, for example, a resist film for opening only portions which are to be removed is formed and then the formed resist film is removed by an isotropic etching method (e.g., dry etching). As a result, both the portion of the upper plane 25c of the supporting portion 25a, which is overlapped with the penetration portion 24, as viewed on the plane, and the portion of the lower plane 25d of the supporting portion 25b, which is overlapped with the penetration portion 24, as viewed on the plane, function as electrode pads when the portions are electrically connected to a wiring board, a semiconductor device, and the like.

In accordance with the semiconductor package 11 related to the second embodiment mode, an effect similar to that of the semiconductor package 10 related to the first embodiment mode can be achieved.

<Third Embodiment Mode>

[Structure of Semiconductor Package Related to Third Embodiment Mode]

Figure 25:
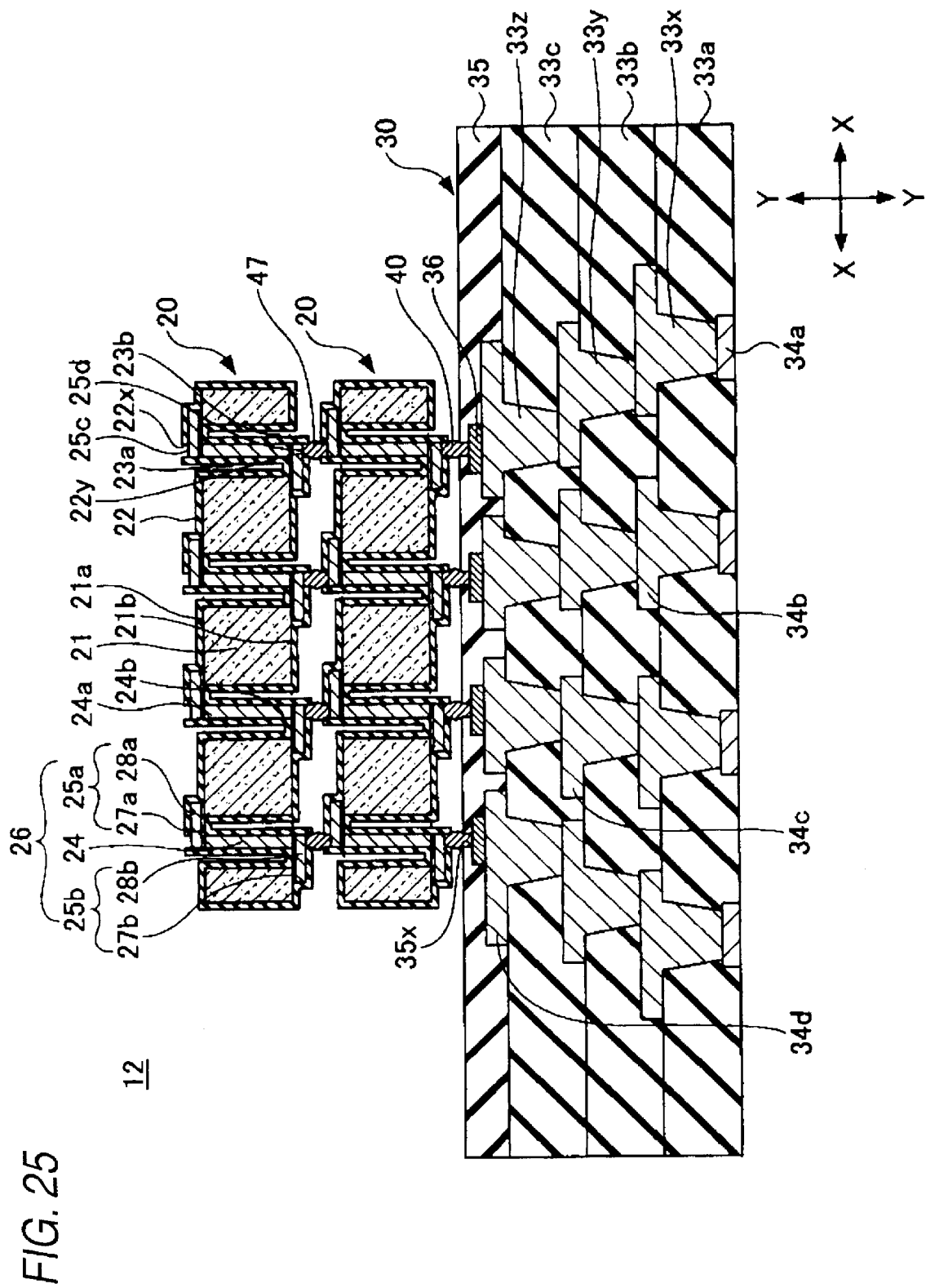
FIG. 25 is a diagram for exemplifying a semiconductor package according to a third embodiment mode of the present invention.

Firstly, a description is made of a structure of a semiconductor package according to a third embodiment mode of the present invention. FIG. 25 is a diagram for exemplifying the semiconductor package 12 according to the third embodiment mode. In FIG. 25, an X-X direction indicates a plane direction which is parallel to the upper plane 21a of the semiconductor chip 21 and a Y-Y direction indicates a direction perpendicular to the X-X direction. In FIG. 25, the same reference numerals will be given to the same structural portions of FIG. 2, and descriptions thereof will be sometimes omitted.

Referring to FIG. 25, the semiconductor package 12 according to the third embodiment mode has such a structure that in the semiconductor package 10 related to the first embodiment mode, another semiconductor device 20 is further formed on the semiconductor device 20. These semiconductor devices 20 are electrically connected via a joining portion 47 to each other. The joining portion 47 may be made as, for example, a solder bump.

[Manufacturing Method of Semiconductor Package Related to Third Embodiment Mode]

Since the semiconductor package 12 related to the third embodiment mode may be manufactured by performing steps similar to those of the semiconductor package 10 related to the first embodiment mode, explanations of the manufacturing method will be omitted. The joining portion 47 may be formed based upon steps similar to those of FIG. 19.

In accordance with the semiconductor package 12 related to the third embodiment mode, an effect similar to that of the semiconductor package 10 related to the first embodiment mode may be achieved.

<Fourth Embodiment Mode>

[Structure of Semiconductor Package Related to Fourth Embodiment Mode]

Figure 26:
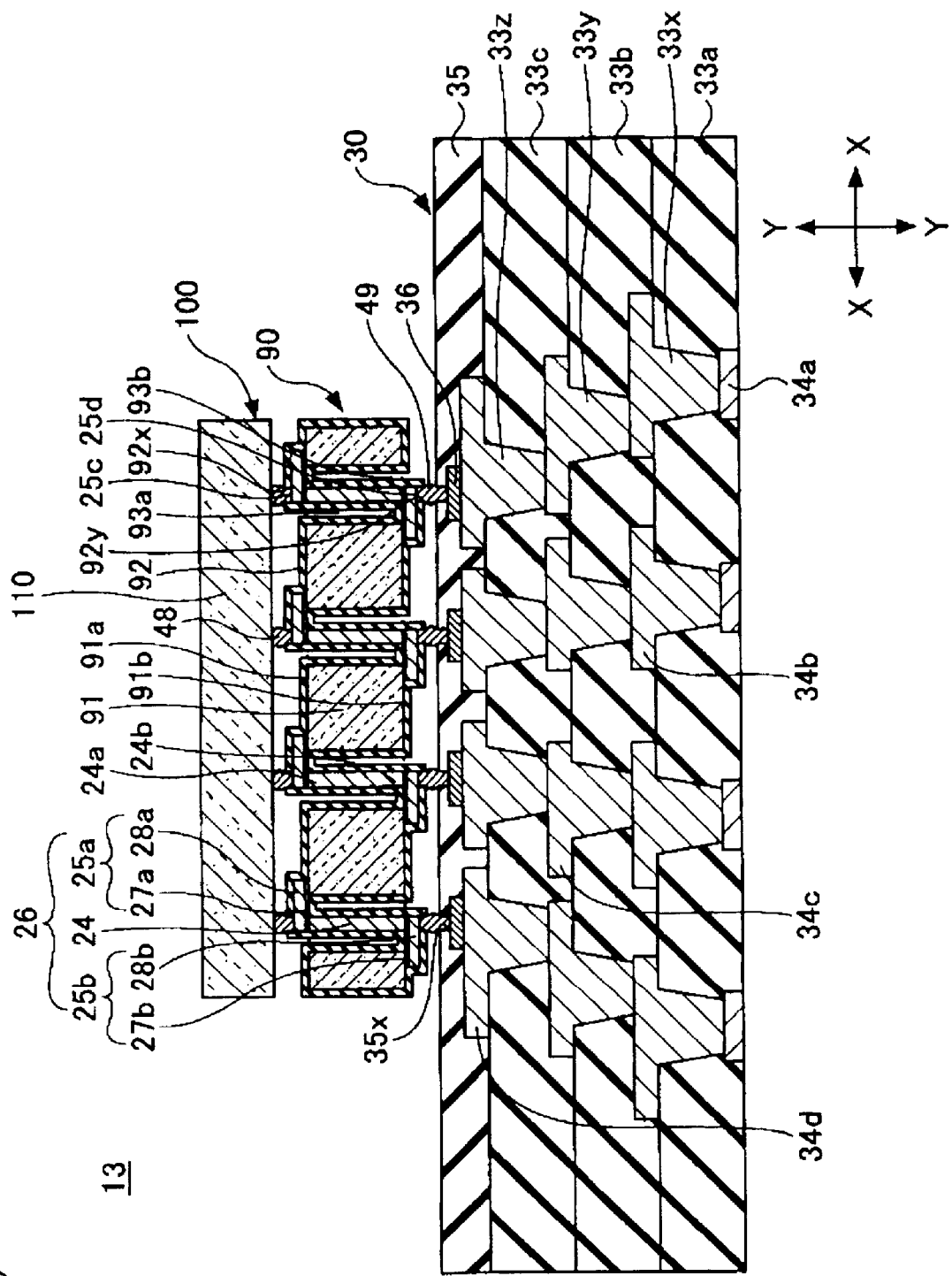
FIG. 26 is a diagram for exemplifying a semiconductor package according to a fourth embodiment mode of the present invention.

Firstly, a description is made of a structure of a semiconductor package according to a fourth embodiment mode of the present invention. FIG. 26 is a diagram for exemplifying the semiconductor package 13 according to the fourth embodiment mode. In FIG. 26, an X-X direction indicates a plane direction which is parallel to an upper plane 91a of a substrate 91 (will be explained later), and a Y-Y direction indicates a direction perpendicular to the X-X direction. In FIG. 26, the same reference numerals will be given to the same structural portions of FIG. 2, and descriptions thereof will be sometimes omitted.

Referring to FIG. 26, a semiconductor package 13 related to the fourth embodiment mode has an interposer 90, a semiconductor device 100, a wiring board 30, a joining portion 48, and a joining portion 49. The semiconductor device 100 is formed via the interposer 90 on the wiring board 30.

The semiconductor device 100 has a semiconductor chip 110. While a semiconductor integrated circuit (not shown) is provided on the semiconductor chip 110, the semiconductor integrated circuit is constituted by a diffusion layer (not shown), an insulating layer (not shown), a via (not shown), a wiring layer (not shown), and the like. Also, an electrode pad (not shown) used when the electrode pad is electrically connected to a wiring board, a semiconductor device, and the like, is provided on the semiconductor chip 110, while the electrode pad is connected to a wiring layer (not shown). As a material of the semiconductor chip 110, for example, silicon, and the like may be employed. A thickness of the semiconductor chip 110 may be made as, for instance, 300 µm.

The joining portion 48 is a terminal provided in order to electrically connect the semiconductor device 100 to the interposer 90. Concretely speaking, the joining portion 48 connects the upper plane 25c of the supporting member 25a exposed within an opening portion 92x in the interposer 90 to the corresponding electrode pad (not shown) in the semiconductor device 100. The joining portion 48 may be formed as, for example, a solder bump.

The interposer 90 has a substrate 91, an insulating film 92, the penetration electrode 26, a space portion 93a, and another space portion 93b. As a material of the substrate 91, silicon, a resin (for example, insulating resin), a metal (for instance, Cu), and the like may be employed. A thickness of the substrate 91 may be made as, for instance, 300 µm.

While the substrate 91 is formed in a plate shape, the substrate 91 has the plurality of space portions 93a, and 93b. The insulating film 92 is formed on a surface of the substrate 91. The insulating film 92 is a film for insulating a space between the substrate 91 and the penetration electrode 26. The insulating film 92 is provided in such a manner that an entire surface (which further contains planes of substrate 91 of portions corresponding to wall planes of space portions 93a and 93b) of the substrate 91, and a portion of the penetration electrode 26 are covered. The insulating film 92 has opening portions 92x and 92y. The opening portion 92x exposes a portion of the upper plane 25c of the supporting portion 25a, which is overlapped with the penetration portion 24, as viewed on the plane. Also, the opening portion 92y exposes a portion of the lower plane 25d of the supporting portion 25b, which is overlapped with the penetration portion 24, as viewed on the plane. As the insulating film 92, for instance, $SiO_2$ may be employed. The insulating film 92 may be formed by, for instance, a CVD method. A thickness of the insulating film 92 may be made as, for example, 0.5 µm to 1.0 µm. It should be noted that when the insulating resin is employed as the material of the substrate 91, the insulating film 92 shown in FIG. 26 is no longer required.

The space portions 93a and 93b are provided in such a manner that an entire side plane of the penetration portion 24 is exposed to a peripheral portion of the penetration portion 24.

The penetration electrode 26 is constructed of the penetration portion 24, and the supporting portions 25a and 25b. The penetration portion 24 is made of a material having electric conductivity. The penetration portion 24 is separated from the substrate 91 and the insulating film 92 by the space portions 93a and 93b, and penetrates the substrate 91 under the condition that the penetration portion 24 is not contacted to the substrate 91 and the insulating film 92.

The edge portion 24a (one edge portion) of the penetration portion 24 is constructed with the supporting portion 25a in an integral manner. The edge portion 24b (the other edge portion) of the penetration portion 24 is constructed with the supporting portion 25b in an integral manner. A shape of the penetration portion 24 is, for example, a circle, as viewed on the plane, and a diameter thereof may be made as, for instance, 30 µm.

The supporting portions 25a and 25b which construct the penetration electrode 26 are constituted by the seed layers 27a and 27b, and the plating films 28a and 28b, while the seed layers 27a and 27b are made of the material having electric conductivity. In the supporting portion 25a, one edge portion is constructed with the edge portion 24a of the penetration portion 24 in an integral manner, and the other edge portion is fixed on an upper plane 91a one plane of substrate 91) of the substrate 91. In the supporting portion 25b, one edge portion is constructed with the edge portion 24b of the penetration portion 24 in an integral manner, and the other edge portion is fixed on a lower plane 91b (the other plane of substrate 91) of the substrate 91.

The supporting portions 25a and 25b have elasticity, and are members which support an entire portion of the penetration portion 24 under such a condition that the penetration portion 24 can be moved along the X-X direction and the Y-Y direction. As a material of the penetration electrode 26 constructed of the penetration portion 24 and the supporting portions 25a and 25b, for example, Cu may be employed. Since Cu is employed as the material of the penetration electrode 26, the supporting portions 25a and 25b may have the elasticity, and may be easily formed by employing a plating method, and the like.

Portions of the upper plane 25c of the supporting portion 25a and the lower plane 25d of the supporting portion 25b, which are exposed within the opening portions 92x and 92y, function as electrode pads when the portions are electrically connected to a wiring board, a semiconductor device, and the like. For instance, an Ni/Au plating layer, or the like, may be alternatively formed on the portions of the upper plane 25c of the supporting portion 25a and the lower plane 25d of the supporting portion 25b, which are exposed within the opening portions 92x and 92y, while an Ni plating layer and an Au plating layer are stacked on each other in this order in the Ni/Au plating layer.

Since the wiring board 30 is made similar to that of the first embodiment mode, a detailed explanation thereof is omitted. The joining portion 49 is a terminal provided in order to electrically connect the interposer 90 to the wiring board 30. Concretely speaking, the joining portion 49 connects the upper plane 25d of the supporting member 25b exposed within the opening portion 92y in the interposer 90 to the metal layer 36 in the wiring board 30. The joining portion 49 may be formed as, for example, a solder bump.

As previously described, while the semiconductor device 100 is formed via the interposer 90 on the wiring board 30, the semiconductor device 100 is electrically and mechanically connected via the joining portion 48 to the interposer 90, and the interposer 90 is electrically and mechanically connected via the joining portion 49 to the wiring board 30. As previously described, while the supporting portions 25a and 25b have the elasticity, the supporting portions 25a and 25b support the entire portion of the penetration portion 24 under movable condition along the X-X direction and the Y-Y direction. Assuming now that heat is applied to the semiconductor package 13, as previously explained, in general, since there is a difference in the thermal expansion coefficients of the semiconductor device 100 and the wiring board 30, it is conceivable that stresses may be produced in the joining portions 48 and 49. However, similar to the penetration portion 24, since the joining portions 48 and 49 are supported under such a condition that the joining portions 48 and 49 can be moved along the X-X direction and the Y-Y direction by the supporting portions 25a and 25b having the elasticity, the stresses produced in the joining portions 48 and 49 can be largely relaxed. As a consequence, it is possible to avoid that a crack occurs in the joining portions 48 and 49.

It should be understood that the interposer 90 which constructs the semiconductor package 13 according to the fourth embodiment mode may be manufactured in a method similar to the methods for manufacturing the semiconductor devices 20 and 50 shown in the first embodiment mode to the third embodiment mode.

In accordance with the semiconductor package 13 related to the fourth embodiment mode, the semiconductor device 100 is electrically connected to the wiring board 30 via the joining portions 48 and 49 provided on the penetration electrode 26 of the interposer 90. The penetration electrode 26 has such a structure that the penetration portion 24 is supported by the supporting portions 25a and 25b under movable condition along the X-X direction and the Y-Y direction. As a result, even in such a case that heat is applied to the semiconductor package 13, the stresses produced in the joining portions 48 and 49 can be considerably relaxed, which are caused by the difference in the thermal expansion coefficients of the semiconductor device 100 and the wiring board 30, and thus, it is possible to avoid that cracks occur in the joining portions 48 and 49.

In particular, there is a merit in such a case that the penetration electrode 26 and the like can be hardly and directly formed in the semiconductor device 100.

<Fifth Embodiment Mode>

Figure 27:
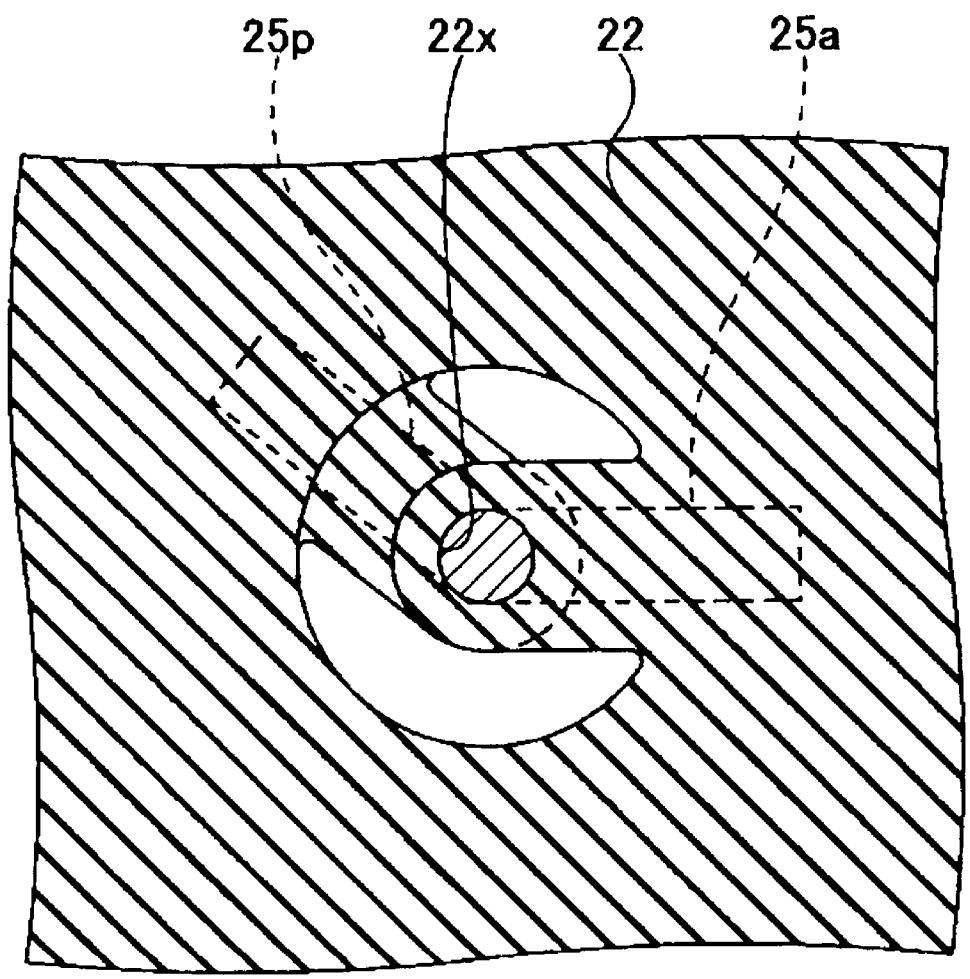
FIG. 27 is a diagram (No. 1) for showing another example of a penetration electrode.
Figure 28:
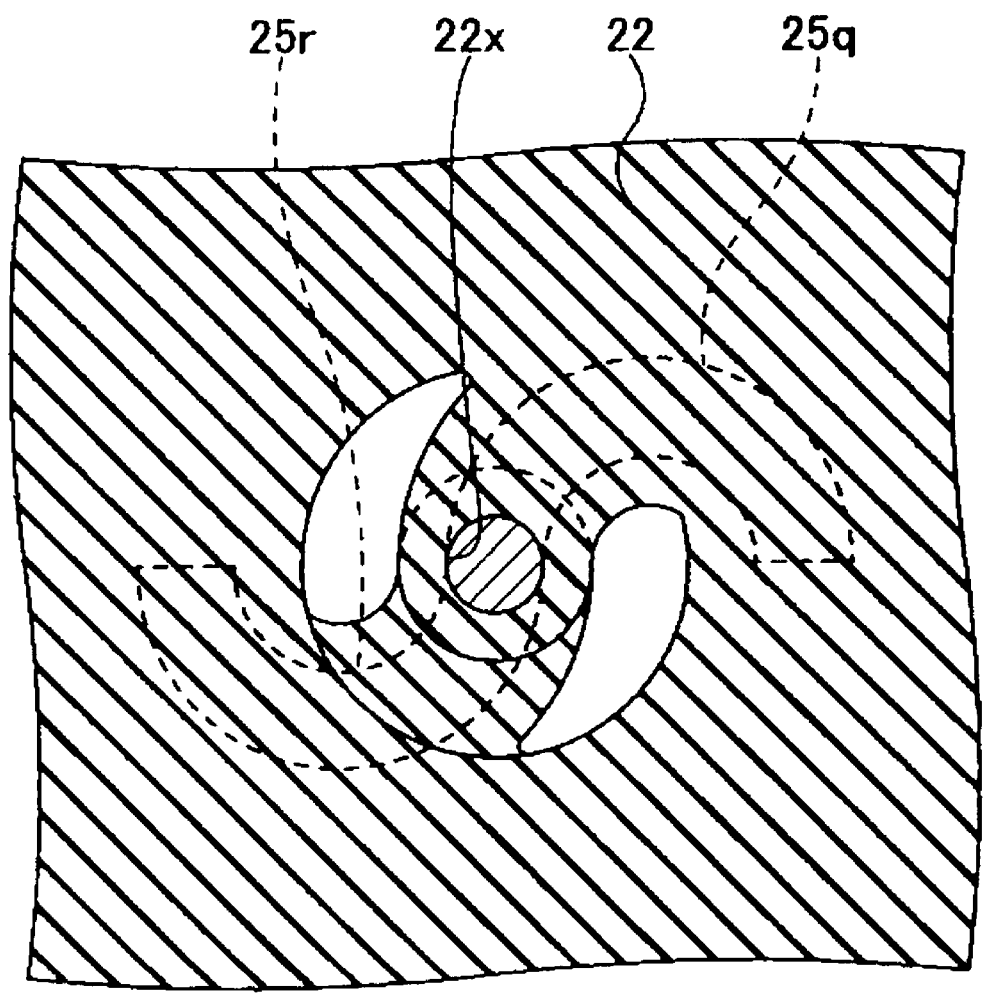
FIG. 28 is a diagram (No. 2) for showing another example of a penetration electrode.
Figure 29:
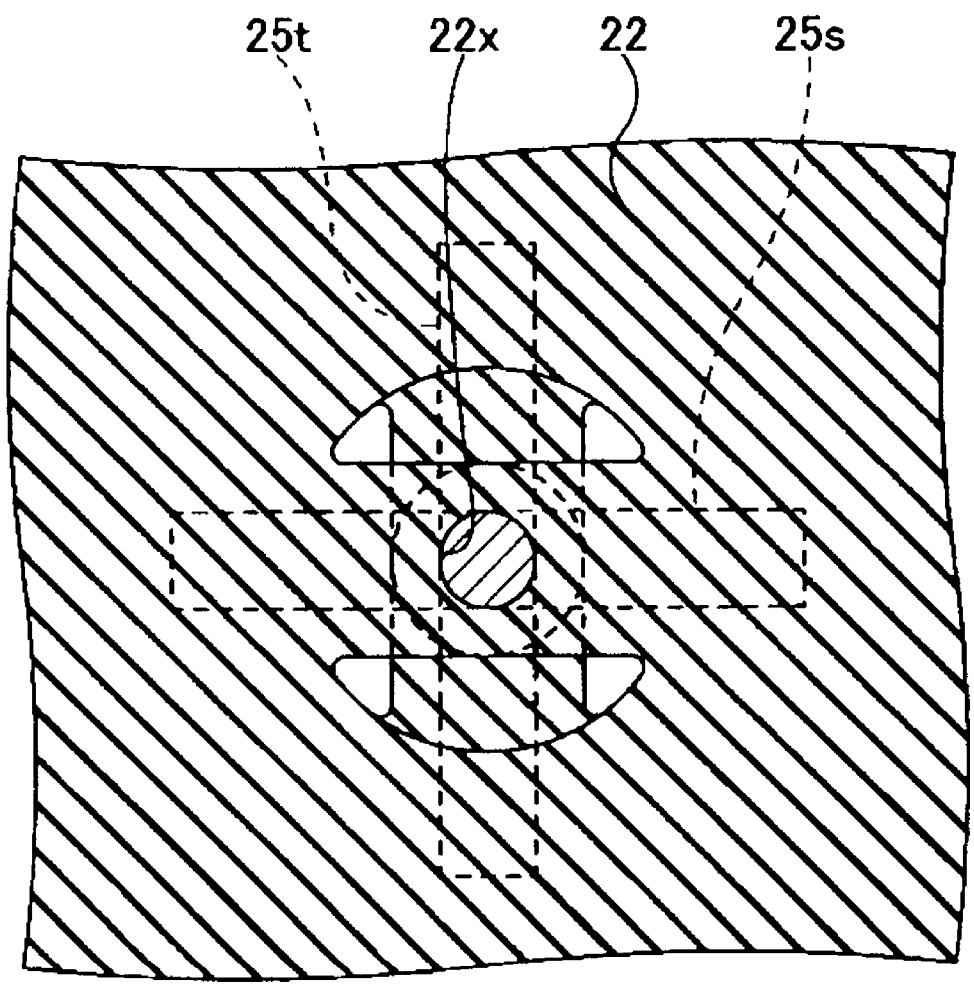
FIG. 29 is a diagram (No. 3) for showing another example of a penetration electrode.

In a fifth embodiment mode of the present invention, other examples of penetration electrodes are indicated. FIGS. 27 to 29 are diagrams for showing other examples of the penetration electrodes. In FIGS. 27 to 29, the same reference numerals will be given to the same structural portions of FIGS. 2 and 3, and descriptions thereof will be sometimes omitted.

In addition to the penetration electrode 26 represented in FIG. 2 and other drawings, a penetration electrode may be alternatively formed even in such a structural mode shown in, for instance, FIG. 27. That is, in the above-described penetration electrode 26, the supporting portions 25a and 25b are formed on a straight line, as viewed on the plane. However, as indicated in FIG. 27, the supporting portion 25a and a supporting portion 25p need not always be formed on the straight line, as viewed on the plane.

A penetration electrode may be alternatively formed even in such a structural mode shown in, for example, FIG. 28. That is, in the above-described penetration electrode 26, the supporting portions 25a and 25b are formed in the straight line shape. Alternatively, supporting portions 25q and 25r may be formed in a spiral shape as shown in FIG. 28.

A penetration electrode may be alternatively formed even in such a structural mode shown in, for example, FIG. 29. That is, in the above-described penetration electrode 26, one end of the supporting portion 25a is fixed on the upper plane 21a of the semiconductor chip 21, and one end of the supporting portion 25b is fixed on the lower plane 21b of the semiconductor chip 21. Alternatively, as indicated by a supporting portion 25s of FIG. 29, both ends thereof may be fixed on the upper plane 21a of the semiconductor chip 21, and as indicated by another supporting portion 25t, both ends thereof may be fixed on the lower plane 21b of the semiconductor chip 21.

Even in any of the above-described cases from FIGS. 27 to 29, a space portion is provided in the peripheral portion of the penetration portion 24 in such a manner that the entire side plane of the penetration portion 24 is exposed. As a result, the respective penetration electrodes represented in FIGS. 27 to 29 may achieve an effect similar to that of the penetration electrode 26 shown in FIG. 2, and the like.

As previously described, the penetration electrodes may be formed in any structural modes if these penetration electrodes have such a structure that while supporting portions for constructing the penetration electrodes have elasticity, the entire portion of the penetration portion 24 is supported by the supporting portions under movable conditions along the X-X direction and Y-Y direction. It should be noted that the penetration electrodes according to the fifth embodiment mode can be manufactured by a method similar to the methods for manufacturing the penetration electrodes according to the first embodiment mode through the fourth embodiment mode.

A semiconductor package having the penetration electrodes related to the fifth embodiment mode may achieve an effect similar to that of the semiconductor package related to the first embodiment mode.

While the preferred embodiment modes have been described in detail, the present invention is not limited only to the above-described embodiment modes, but various sorts of modifications and substitutions may be applied to the above-described embodiment modes without departing from the technical scope defined in the claims.

For example, the wiring boards which constitute the semiconductor packages according to the respective embodiment modes are not limited only to wiring boards equipped with build-up wiring layers without core portions, which are exemplified in the first embodiment mode, and the like. Various sorts of wiring boards may be alternatively employed, namely, a single-plane (one-layer) wiring board in which a wiring layer is formed only on a single plane of the board may be employed; a double-plane (two-layer) wiring board in which wiring layers are formed on both planes of the board may be employed; a penetration multilayer wiring board in which respective wiring layers are connected to each other by employing through vias may be employed; a wiring board equipped with a build-up wiring layer having a core portion may be employed; an IVH multilayer wiring board in which a specific wiring layer is connected by utilizing an IVH (Interstitial Via Hole) may be employed; and so on.

Also, in the semiconductor package 12 according to the third embodiment mode, another structure may be alternatively employed in which either one or plural pieces of semiconductor devices 20 are furthermore formed on the semiconductor device 20.

In the respective embodiment modes, the solder bumps are exemplified as the joining portions. Alternatively, an Au bump, paste having electric conductivity, and the like, except for the solder bumps may be alternatively employed.

What is claimed is:
1. A semiconductor package comprising:
a wiring board; and
a semiconductor device disposed on the wiring board; wherein
the semiconductor device comprises:
a semiconductor chip having a first surface and a second surface opposite to the first surface; and a penetration electrode which penetrates the semiconductor chip, the penetration electrode having a first supporting portion fixed on the first surface of the semiconductor chip, a second supporting portion fixed on the second surface of the semiconductor chip, and a penetration portion arranged in a space portion formed in the semiconductor chip, the penetration electrode penetrating the semiconductor chip in such a manner that the penetration portion is entirely separated from a wall plane of the semiconductor chip by at least the space portion, said space portion being empty space; and the wiring board and the semiconductor device are electrically connected via the penetration electrode, wherein a wall plane of the semiconductor chip within the space portion is covered with an insulating film, and the penetration portion is entirely separated from the insulating film covering the wall plane of the semiconductor chip by the space portion, and a surface of the penetration portion is covered by an insulating film, and the insulating film covering the penetration portion is separated from the insulating film covering the wall plane of the semiconductor chip by the space portion.

2. A semiconductor package comprising:

a wiring board; and a semiconductor device disposed on the wiring board via an interposer; wherein the interposer comprises:

a substrate having a first surface and a second surface opposite to the first surface; and a penetration electrode which penetrates the substrate, the penetration electrode having a first supporting portion fixed on the first surface of the substrate, a second supporting portion fixed on the second surface of the substrate, and a penetration portion arranged in a space portion formed in the substrate, the penetration electrode penetrating the substrate in such a manner that the penetration portion is entirely separated from a wall plane of the substrate by the space portion, said space portion being empty space; and the wiring board and the semiconductor device are electrically connected via the penetration electrode, wherein a wall plane of the substrate within the space portion is covered with an insulating film, and the penetration portion is entirely separated from the insulating film covering the wall plane of the substrate by the space portion, and a surface of the penetration portion is covered by an insulating film, and the insulating film covering the penetration portion is separated from the insulating film covering the wall plane of the substrate by the space portion.

3. The semiconductor package as in claim 1, wherein the first supporting portion and the second supporting portion of the penetration electrode are electrically connected to a wiring layer of the semiconductor chip.

4. The semiconductor package as in claim 1, wherein the first supporting portion has elasticity, is constructed with the penetration portion in an integral manner, and is fixed on the first surface of the semiconductor chip; and the second supporting portion has elasticity, is constructed with the penetration portion in an integral manner, and is fixed on the second surface of the semiconductor chip.

5. The semiconductor package as in claim 4, further comprising:

projection portions made of a metal provided on surfaces of the first supporting portion and the second supporting portion.

6. The semiconductor package as in claim 1, wherein the penetration electrode is made of Cu (copper).

7. The semiconductor package as in claim 1, further comprising:

one or a plurality of semiconductor devices formed on the semiconductor device, wherein the semiconductor device is electrically connected to the one, or the plurality of semiconductor devices via penetration electrodes formed thereon.

8. The semiconductor package as in claim 2, wherein the first supporting portion has elasticity, is constructed with the penetration portion in an integral manner, and is fixed on the first surface of the substrate; and the second supporting portion has elasticity, is constructed with the penetration portion in an integral manner, and is fixed on the second surface of the substrate.

9. The semiconductor package as in claim 8, further comprising:

projection portions made of a metal provided on surfaces of the first supporting portion and the second supporting portion.

10. The semiconductor package as in claim 2, wherein the penetration electrode is made of Cu (copper).

11. The semiconductor package as in claim 2, further comprising:

one or a plurality of semiconductor devices formed on the interposer, wherein the interposer is electrically connected to the one, or the plurality of semiconductor devices via penetration electrodes formed in the interposer.

12. A semiconductor device, comprising:

a substrate having a first surface and a second surface opposite to the first surface, and having a space portion formed therein, the space portion extending between the first and second surfaces; and a penetration electrode which penetrates the substrate, the penetration electrode having a first supporting portion fixed on the first surface of the substrate, a second supporting portion fixed on the second surface of the substrate, and a penetration portion arranged in the space portion formed in the substrate, the penetration portion arranged so as to be entirely separated from a wall plane of the substrate which defines the space portion by at least a portion of the space portion, said space portion being empty space, wherein a wall plane of the semiconductor chip within the space portion is covered with an insulating film, and the penetration portion is entirely separated from the insulating film covering the wall plane of the semiconductor chip by the space portion, and a surface of the penetration portion is covered by an insulating film, and the insulating film covering the penetration portion is separated from the insulating film covering the wall plane of the semiconductor chip by the space portion.

13. The semiconductor device according to claim 12, wherein the penetration electrode is provided to electrically connect the semiconductor device to an associated wiring board.

* * * * *